United States Patent
Park et al.

(10) Patent No.: US 11,236,270 B2
(45) Date of Patent: Feb. 1, 2022

(54) QUANTUM DOTS, A COMPOSITION OR COMPOSITE INCLUDING THE SAME, AND AN ELECTRONIC DEVICE INCLUDING THE SAME

(71) Applicant: SAMSUNG ELECTRONICS CO., LTD., Suwon-si (KR)

(72) Inventors: Garam Park, Seoul (KR); Tae Gon Kim, Hwaseong-si (KR); Jooyeon Ahn, Suwon-si (KR); Ji-Yeong Kim, Suwon-si (KR); Nayoun Won, Suwon-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 95 days.

(21) Appl. No.: 16/507,406

(22) Filed: Jul. 10, 2019

(65) Prior Publication Data
US 2020/0172806 A1 Jun. 4, 2020

(30) Foreign Application Priority Data
Nov. 29, 2018 (KR) .................. 10-2018-0151185

(51) Int. Cl.
*C09K 11/88* (2006.01)
*C09K 11/02* (2006.01)
(Continued)

(52) U.S. Cl.
CPC ............ *C09K 11/883* (2013.01); *C09K 11/02* (2013.01); *G02F 1/133617* (2013.01); *H01L 27/322* (2013.01); *H01L 27/3244* (2013.01)

(58) Field of Classification Search
CPC ....... C09K 11/883; C09K 11/02; C09K 11/70; C09K 11/565; C09K 11/025;
(Continued)

(56) References Cited

U.S. PATENT DOCUMENTS

2014/0001405 A1 1/2014 Guo et al.
2017/0059988 A1* 3/2017 Paek ............... G02B 5/206
(Continued)

FOREIGN PATENT DOCUMENTS

CN 108048073 A 5/2018
KR 20110091361 A 8/2011
(Continued)

OTHER PUBLICATIONS

Eunbyul Bang et al., "Large-Scale Synthesis of Highly Luminescent InP@ZnS Quantum Dots Using Elemental Phosphorus Precursor," Chemistry of Materials, Apr. 24, 2017, pp. 4236-4243, vol. 29, Issue 10.
(Continued)

*Primary Examiner* — Robert G Bachner
(74) *Attorney, Agent, or Firm* — Cantor Colburn LLP

(57) ABSTRACT

Disclosed are a quantum dot and a quantum dot-polymer composite and a device including the same, wherein the quantum dot includes a semiconductor nanocrystal core including indium (In) and phosphorous (P), a first semiconductor nanocrystal shell disposed on the semiconductor nanocrystal core, the first semiconductor nanocrystal shell including zinc and selenium, and a second semiconductor nanocrystal shell disposed on the first semiconductor nanocrystal shell, the second semiconductor nanocrystal shell including zinc and sulfur, wherein the quantum dot does not include cadmium, wherein in the quantum dot, a mole ratio of sulfur with respect to selenium is less than or equal to about 2.5:1.

27 Claims, 4 Drawing Sheets

(51) Int. Cl.
*G02F 1/13357* (2006.01)
*H01L 27/32* (2006.01)

(58) Field of Classification Search
CPC ............ G02F 1/133617; G02F 1/1336; G02F 2001/133614; H01L 27/322; H01L 27/3244; H01L 51/502; H01L 51/50; H01L 51/5203; G09F 9/33; G03F 7/004; G03F 7/027
See application file for complete search history.

(56) References Cited

U.S. PATENT DOCUMENTS

| | | | |
|---|---|---|---|
| 2017/0248477 A1 | 8/2017 | Zhao et al. | |
| 2017/0250322 A1 | 8/2017 | Wang et al. | |
| 2017/0306227 A1* | 10/2017 | Ippen | C09K 11/02 |
| 2017/0335187 A1 | 11/2017 | Guo et al. | |
| 2018/0033856 A1* | 2/2018 | Kwon | C09K 11/02 |
| 2018/0119007 A1 | 5/2018 | Ippen et al. | |
| 2018/0201834 A1 | 7/2018 | Banin et al. | |
| 2018/0301592 A1 | 10/2018 | Peng et al. | |

FOREIGN PATENT DOCUMENTS

| | | |
|---|---|---|
| KR | 20160142187 A | 12/2016 |
| WO | 2013127662 A1 | 9/2013 |
| WO | 2018188604 A1 | 10/2018 |

OTHER PUBLICATIONS

Hee Yeon Kim et al., "Transparent InP Quantum Dot Light-Emitting Diodes with $ZrO_2$ Electron Transport Layer and Indium Zinc Oxide Top Electrode," Advanced Functional Materials, Apr. 6, 2016, pp. 3454-3461, vol. 26.

Kyungnam Kim et al., "Highly luminescing multi-shell semiconductor nanocrystals InP/ZnSe/ZnS," Applied Physics Letters, Aug. 14, 2012, pp. 073107-1-073107-4, vol. 101, Issue 7.

Extended European Search Report dated Jan. 24, 2020, of the corresponding European Patent Application No. 19185460.3.

* cited by examiner

FIG. 4
Pattern Preparation by using a photoresist
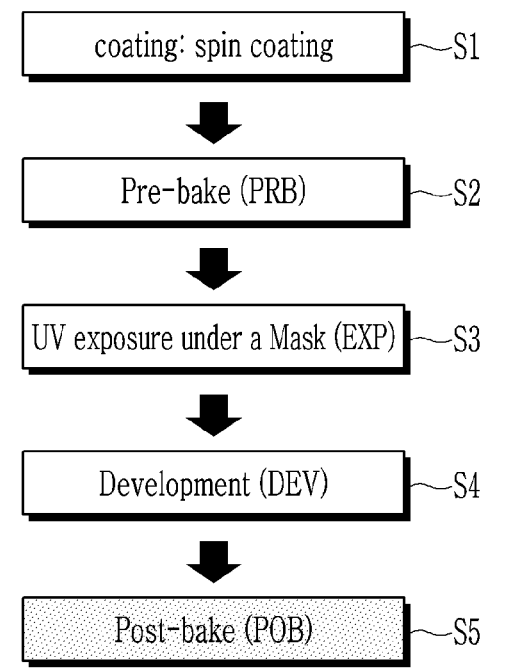
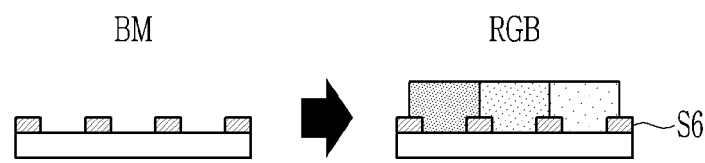
Repeating the Patterning Process three times

QUANTUM DOTS, A COMPOSITION OR COMPOSITE INCLUDING THE SAME, AND AN ELECTRONIC DEVICE INCLUDING THE SAME

CROSS-REFERENCE TO RELATED APPLICATION

This application claims priority to and the benefit of Korean Patent Application No. 10-2018-0151185, filed in the Korean Intellectual Property Office on Nov. 29, 2018, and all the benefits accruing therefrom under 35 U.S.C. § 119, the content of which in its entirety is herein incorporated by reference.

BACKGROUND

1. Field

Quantum dots, a composition or composite including same, and an electronic device including the same are disclosed.

2. Description of the Related Art

Unlike a bulk material, quantum dots (e.g., nano-sized semiconductor nanocrystals) may have different energy bandgaps by controlling the sizes and compositions of the quantum dots. Quantum dots may exhibit electroluminescent and photoluminescent properties. In a colloidal synthesis, organic materials such as a dispersing agent may coordinate, e.g., be bound, to a surface of the semiconductor nanocrystal during the crystal growth thereof, and a quantum dot having a controlled size and having luminescent properties may be provided. From an environmental standpoint, developing a cadmium free quantum dot with improved luminescent properties is desirable.

SUMMARY

An embodiment provides cadmium free quantum dots that may exhibit improved photoluminescence properties and enhanced stability.

An embodiment provides a method of producing the cadmium free quantum dots.

An embodiment provides a composition including the cadmium free quantum dot.

An embodiment provides a quantum dot-polymer composite including cadmium free quantum dot.

An embodiment provides a layered structure and an electronic device including the quantum dot-polymer composite.

In an embodiment, a quantum dot includes a semiconductor nanocrystal core including indium (In) and phosphorous (P), a first semiconductor nanocrystal shell disposed on the semiconductor nanocrystal core, the first semiconductor nanocrystal shell including zinc and selenium, and a second semiconductor nanocrystal shell disposed on the first semiconductor nanocrystal shell, the second semiconductor nanocrystal shell including zinc and sulfur,
wherein the quantum dot does not include cadmium and
wherein in the quantum dot, a mole ratio of sulfur with respect to selenium (S/Se) is less than or equal to about 2.5:1.

A thickness of the first semiconductor nanocrystal shell may be greater than or equal to about 3 monolayers.

A thickness of the second semiconductor nanocrystal shell may be less than 0.7 nanometers (nm).

In the quantum dot, a mole ratio of zinc with respect to indium may be less than or equal to about 50:1, less than or equal to about 49:1, less than or equal to about 48:1, less than or equal to about 47:1, or less than or equal to about 46:1.

In the quantum dot, a mole ratio of zinc with respect to indium may be less than or equal to about 45:1.

In the quantum dot, a mole ratio of zinc with respect to indium may be less than or equal to about 40:1.

In an embodiment, the quantum dot has a photoluminescent peak wavelength in a range from about 500 nm to about 550 nm, and a molar ratio of zinc with respect to indium may be less than or equal to about 48:1, less than or equal to about 47:1, less than or equal to about 46:1, less than or equal to about 45:1, less than or equal to about 44:1, less than or equal to about 43:1, less than or equal to about 42:1, less than or equal to about 41:1, less than or equal to about 40:1, less than or equal to about 35:1, less than or equal to about 25:1, less than or equal to about 23:1, or less than or equal to about 22:1 (and/or greater than or equal to about 5:1, greater than or equal to about 6:1, greater than or equal to about 7:1, greater than or equal to about 8:1, greater than or equal to about 9:1, greater than or equal to about 10:1, greater than or equal to about 20:1, greater than or equal to about 30:1, greater than or equal to about 35:1, greater than or equal to about 40:1, or greater than or equal to about 43:1).

In an embodiment, the quantum dot has a photoluminescent (PL) peak wavelength in a range from about 600 nanometers (nm) to about 650 nm, and a molar ratio of zinc with respect to indium may be less than or equal to about 30:1, less than or equal to about 28:1, less than or equal to about 25:1, less than or equal to about 20:1, less than or equal to about 19:1, less than or equal to about 18:1, less than or equal to about 17:1, less than or equal to about 16:1, less than or equal to about less than or equal to about 15:1, less than or equal to about 14:1, or less than or equal to about 13:1 (and/or greater than or equal to about 3:1, greater than or equal to about 4:1, greater than or equal to about 5:1 or greater than or equal to about 9:1).

In an embodiment, the quantum dot has a photoluminescent peak wavelength in a range from about 500 nm to about 550 nm, and a molar ratio of the sulfur with respect to the selenium may be greater than or equal to about 0.05:1, greater than or equal to about 0.07:1, greater than or equal to about 0.1:1, greater than or equal to about 0.2:1, or greater than or equal to about 0.3:1 and less than or equal to about 1:1, less than or equal to about 0.9:1, or less than or equal to about 0.8:1, less than or equal to about 0.7:1, less than or equal to about 0.6:1.

In an embodiment, the quantum dot has a photoluminescent (PL) peak wavelength in a range from about 600 nanometers (nm) to about 650 nm, and a molar ratio of the sulfur with respect to the selenium may be greater than or equal to about 0.1:1, or greater than or equal to about 0.2:1 and less than or equal to about 2:1, or less than or equal to about 1.5.

A thickness of the first semiconductor nanocrystal shell may be greater than or equal to about 0.9 nm, greater than or equal to about 1.2 nm, greater than or equal to about 1.5 nm, or greater than or equal to about 2 nm.

A thickness of the first semiconductor nanocrystal shell may be less than or equal to about 3 nm, less than or equal to about 2.9 nm, less than or equal to about 2.8 nm, less than or equal to about 2.7 nm, less than or equal to about 2.6 nm, less than or equal to about 2.5 nm, less than or equal to about 2.4 nm, less than or equal to about 2.3 nm, less than or equal to about 2.2 nm, less than or equal to about 2.1 nm, less than or equal to about 2 nm, less than or equal to about 1.9 nm, less than or equal to about 1.8 nm, less than or equal to about 1.7 nm, less than or equal to about 1.6 nm, less than or equal to about 1.5 nm, or less than or equal to about 1.4 nm.

A thickness of the second semiconductor nanocrystal shell may be less than or equal to about 0.6 nm.

A quantum efficiency of the quantum dot may be greater than or equal to about 65%.

A quantum efficiency of the quantum dot may be greater than or equal to about 70%.

In an ultraviolet-visible (UV-Vis) absorption spectrum of the quantum dot, a ratio of an absorbance at 450 nm to an absorbance at 350 nm may be greater than or equal to about 0.08:1.

The semiconductor nanocrystal core may further include zinc.

The first semiconductor nanocrystal shell may not include sulfur.

The first semiconductor nanocrystal shell may be disposed directly on a surface of the semiconductor nanocrystal core.

The second semiconductor nanocrystal shell may be an outermost layer of the quantum dot.

The second semiconductor nanocrystal shell may be disposed directly on a surface of the first semiconductor nanocrystal shell.

In an embodiment, the quantum dot has a photoluminescent peak wavelength in a range from about 500 nm to about 550 nm, and the core may have a size of greater than or equal to about 1 nm and less than or equal to about 2.7 nm.

In an embodiment, the quantum dot has a photoluminescent (PL) peak wavelength in a range from about 600 nanometers (nm) to about 650 nm, and the core may have a size of greater than or equal to about 2 nm.

The quantum dot may not include an alkane monothiol compound on a surface thereof.

In an embodiment, a composition includes the aforementioned quantum dot, a dispersing agent, and a (organic) solvent. The dispersing agent may include a carboxylic acid group containing binder polymer. The composition may further include a photopolymerizable monomer including a carbon-carbon double bond and optionally a (thermal or photo) initiator.

In an embodiment, a quantum dot-polymer composite includes a polymer matrix and (e.g., a plurality of) the aforementioned quantum dot(s) dispersed in the polymer matrix.

The polymer matrix may include a linear polymer, a crosslinked polymer, or a combination thereof.

The polymer matrix may include a carboxylic acid group containing binder polymer.

The carboxylic acid group containing binder polymer may include:

a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer including a backbone structure in which two aromatic rings are bound to a quaternary carbon atom that is a constituent atom of another cyclic moiety in a main chain of the backbone structure, the multiple aromatic ring-containing polymer including a carboxylic acid group (—COOH);

or a combination thereof.

The polymer matrix may further include a polymerization product of a monomer combination including a compound including a carbon-carbon double bond and a (multiple or mono-functional) thiol compound including at least one (or at least two) thiol group(s) (e.g., at a terminal end of the thiol compound), a metal oxide fine particle, or a combination thereof.

The quantum dot-polymer composite may be in a form of a patterned film.

When the quantum dot-polymer composite may be in a form of a film having a thickness of about 6 micrometers (μm), an amount of a quantum dot is less than or equal to about 45% by weight, based on a total weight of the composite, and an absorption rate of blue light of a wavelength of about 450 nm may be greater than or equal to about 89%.

In an embodiment, a display device includes a light source and a light emitting element, wherein the light emitting element includes the aforementioned quantum dot-polymer composite and the light source is configured to provide the light emitting element with incident light.

The incident light may have a luminescence peak wavelength of about 440 nanometers to about 460 nanometers.

In an embodiment, the light emitting element may include a sheet including the quantum dot-polymer composite.

In an embodiment, the light emitting element may include a stacked structure including a substrate and a light emitting layer disposed on the substrate, wherein the light emitting layer includes a pattern including the quantum dot-polymer composite.

The pattern may include at least one repeating section configured to emit light at a predetermined wavelength.

The pattern may include a first section configured to emit a first light.

The pattern may further include a second section configured to emit a second light having a center wavelength that is different from a center wavelength of the first light.

In an embodiment, a method of forming the aforementioned quantum dot includes:

combining the semiconductor nanocrystal core, a selenium-containing precursor, a first shell precursor containing zinc, an organic ligand, and an organic solvent to obtain a first mixture;

heating the first mixture to a reaction temperature to obtain a second mixture comprising a particle comprising the first semiconductor nanocrystal shell disposed on the semiconductor nanocrystal core;

combining a sulfur-containing precursor with the second mixture at the reaction temperature to form the second semiconductor nanocrystal shell on the first semiconductor nanocrystal shell and form the quantum dot.

Quantum dots of an embodiment may exhibit improved luminous properties together with enhanced stability. A composition including the aforementioned quantum dots may provide improved processability. The quantum dots may find uses in various display devices and biological labelling (e.g., bio sensor, bio imaging, etc.), a photo detector, a solar cell, a hybrid composite, or the like.

The quantum dots of an embodiment may exhibit enhanced blue light absorption, which may find their potential uses in a quantum dot based photoluminescent color filter. The photoluminescent color filter may be used in a display device that includes various blue light sources (e.g., a blue light emitting OLED, a micro LED emitting blue light) and a liquid crystal display device including a blue light source.

BRIEF DESCRIPTION OF THE DRAWINGS

These and/or other aspects will become apparent and more readily appreciated from the following description of the embodiments, taken in conjunction with the accompanying drawings in which:

FIG. 4 shows a process of producing a quantum dot-polymer composite pattern using a composition according to an embodiment.

DETAILED DESCRIPTION

Figure 1:
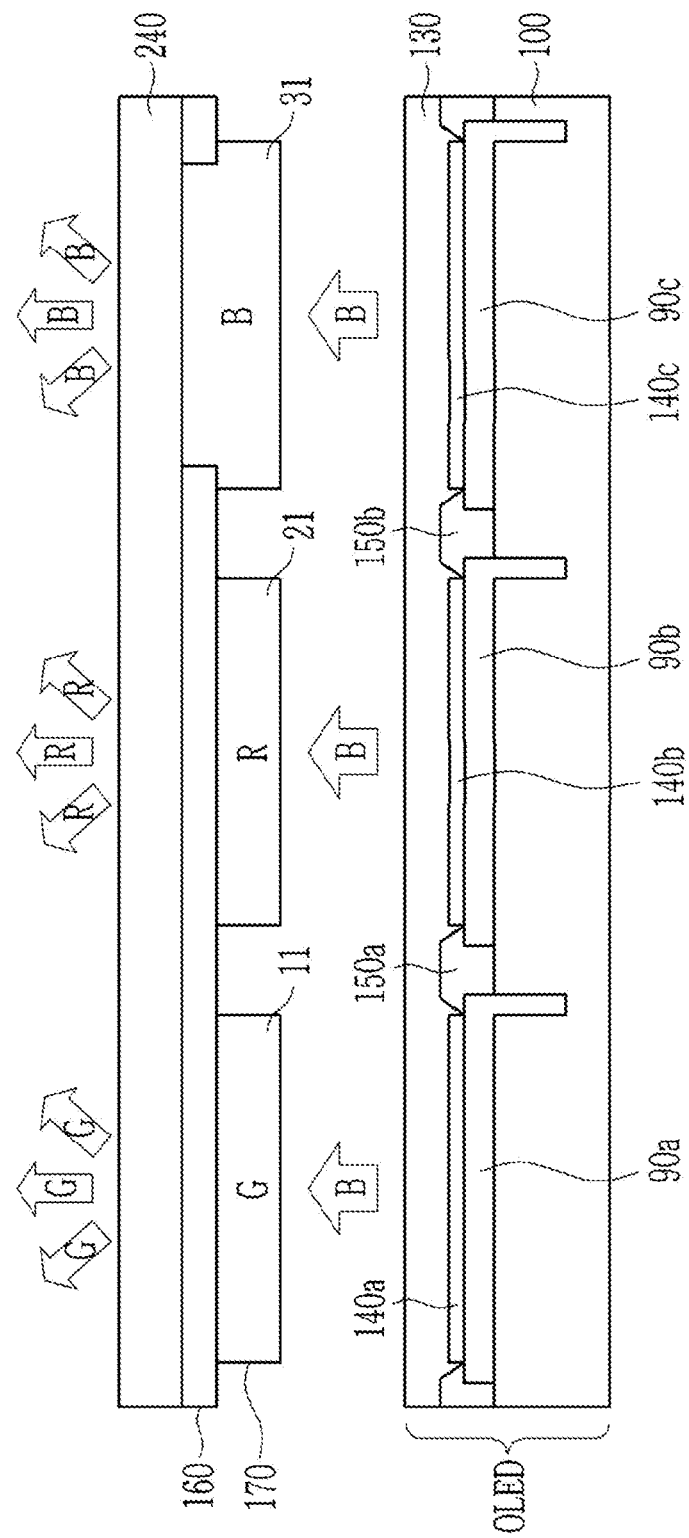
FIG. 1 is a cross-sectional view of a device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, unless a definition is otherwise provided, the term "substituted" refers to a compound or a group or a moiety wherein at least one hydrogen atom thereof is substituted with a substituent. The substituent may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—ON), an amino group or amine group (—NRR', wherein R and R' are the same or different, and are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxylic acid group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, unless a definition is otherwise provided, the term "hetero" refers to a compound or group that includes at least one (e.g., one to three) heteroatom(s), wherein the heteroatom(s) is each independently N, O, S, Si, P, or a combination thereof.

As used herein, unless a definition is otherwise provided, the term "alkylene group" refers to a straight or branched chain, saturated aliphatic hydrocarbon group having a valence of at least two. The alkylene group may be optionally substituted with one or more substituents.

As used herein, unless a definition is otherwise provided, the term "arylene group" refers to a functional group having a valence of at least two and formed by the removal of at least two hydrogen atoms from one or more rings of an aromatic hydrocarbon, wherein the hydrogen atoms may be removed from the same or different rings (preferably different rings), each of which rings may be aromatic or nonaromatic. The arylene group may be optionally substituted with one or more substituents.

As used herein, unless a definition is otherwise provided, the term "aliphatic hydrocarbon" refers to a C1 to C30 linear or branched alkyl group, a C2 to C30 linear or branched alkenyl group, or C2 to C30 linear or branched alkynyl group, the term "aromatic hydrocarbon group" refers to a C6 to C30 aryl group or a C2 to C30 heteroaryl group, and the term "alicyclic hydrocarbon group" refers to a C3 to C30 cycloalkyl group, a C3 to C30 cycloalkenyl group, or a C3 to C30 cycloalkynyl group.

As used herein, unless a definition is otherwise provided, the term "(meth)acrylate" refers to acrylate, and/or methacrylate, or a combination thereof. The (meth)acrylate may include a (C1 to C10 alkyl)acrylate, a (C1 to C10 alkyl) methacrylate, or a combination thereof.

As used herein, unless a definition is otherwise provided, "alkoxy" refers to an alkyl group that is linked via an oxygen (i.e., alkyl-O—), for example methoxy, ethoxy, and sec-butyloxy groups.

As used herein, unless a definition is otherwise provided, "alkyl" refers to a straight or branched chain, saturated, monovalent hydrocarbon group (e.g., methyl or hexyl).

As used herein, unless a definition is otherwise provided, "alkynyl" refers to a straight or branched chain, monovalent hydrocarbon group having at least one carbon-carbon triple bond (e.g., ethynyl).

As used herein, unless a definition is otherwise provided, an "amine" group has the general formula —NRR, wherein each R is independently hydrogen, a C1-C12 alkyl group, a C7-C20 alkylarylene group, a C7-C20 arylalkylene group, or a C6-C18 aryl group.

As used herein, unless a definition is otherwise provided, "arene" refers to a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

As used herein, unless a definition is otherwise provided, "aromatic" refers to an organic compound or group comprising at least one unsaturated cyclic group having delocalized pi electrons. The term encompasses both hydrocarbon aromatic compounds and heteroaromatic compounds.

As used herein, unless a definition is otherwise provided, "aryl" refers to a monovalent hydrocarbon group formed by the removal of one hydrogen atom from one or more rings of an arene (e.g., phenyl or naphthyl).

As used herein, unless a definition is otherwise provided, "arylalkyl" refers to a substituted or unsubstituted aryl group covalently linked to an alkyl group that is linked to a compound (e.g., a benzyl is a C7 arylalkyl group).

As used herein, unless a definition is otherwise provided, "cycloalkenyl" refers to a monovalent hydrocarbon group having one or more rings and one or more carbon-carbon double bond in the ring, wherein all ring members are carbon (e.g., cyclopentyl and cyclohexyl).

As used herein, unless a definition is otherwise provided, "cycloalkyl" refers to a monovalent hydrocarbon group having one or more saturated rings in which all ring members are carbon (e.g., cyclopentyl and cyclohexyl).

As used herein, unless a definition is otherwise provided, "cycloalkynyl" refers to a stable aliphatic monocyclic or polycyclic group having at least one carbon-carbon triple bond, wherein all ring members are carbon (e.g., cyclohexynyl).

As used herein, unless a definition is otherwise provided, "ester" refers to a group of the formula —O(O=O)Rx or a group of the formula —(O=O)ORx wherein Rx is C1 to C28 aromatic organic group or aliphatic organic group. An ester group includes a C2 to C30 ester group, and specifically a C2 to C18 ester group.

As used herein, unless a definition is otherwise provided, the term "hetero" refers to inclusion of at least one to three heteroatoms selected from, N, O, S, Si, and P.

As used herein, unless a definition is otherwise provided, "heteroalkyl" refers to an alkyl group that comprises at least one heteroatom covalently bonded to one or more carbon atoms of the alkyl group. Each heteroatom is independently chosen from nitrogen (N), oxygen (O), sulfur (S), and or phosphorus (P).

As used herein, unless a definition is otherwise provided, "heteroaryl" refers to an aromatic group that comprises at least one heteroatom covalently bonded to one or more carbon atoms of aromatic ring.

As used herein, a photoconversion efficiency refers to a ratio of emission light amount of a quantum dot-polymer composite with respect to absorbed light amount by the composite from incident light (e.g., blue light). The total light amount (B) of excitation light may be obtained by integration of a photoluminescence (PL) spectrum of the incident light, the PL spectrum of the quantum dot-polymer composite film is measured to obtain a dose (A) of light in a green or red light wavelength region emitted from the quantum dot-polymer composite film and a dose (B') of incident light passing through the quantum dot-polymer composite film, and a photoconversion efficiency is obtained by the following equation:

$$A/(B-B') \times 100\% = \text{photoconversion efficiency (\%)}$$

$$(B-B')/B \times 100\% = \text{a blue(light)absorption rate of a film (\%)}$$

As used herein, unless a definition is otherwise provided, the term "dispersion" refers to a system in which a dispersed phase is a solid and a continuous phase includes a liquid. For example, the term "dispersion" may refer to a colloidal dispersion, wherein the dispersed phase includes particles having a dimension of at least about 1 nm (e.g., at least about 2 nm, at least about 3 nm, or at least about 4 nm) and less than or equal to about several micrometers (μm) (e.g., 2 μm or less, or 1 μm or less).

In the specification, the term "Group" in the term Group III, Group II, or the like refers to a group of the Periodic Table of Elements.

As used herein, "Group I" refers to Group IA and Group IB, and may include Li, Na, K, Rb, and Cs but are not limited thereto.

As used herein, "Group II" refers to Group IIA and a Group IIB, and examples of the Group II metal may include Cd, Zn, Hg, and Mg, but are not limited thereto.

As used herein, "Group III" refers to Group IIIA and Group IIIB, and examples of the Group III metal may include Al, In, Ga, and TI, but are not limited thereto.

As used herein, "Group IV" refers to Group IVA and Group IVB, and examples of the Group IV metal may include Si, Ge, and Sn but are not limited thereto. As used herein, the term "a metal" may include a semi-metal such as Si.

As used herein, "Group V" refers to Group VA and may include nitrogen, phosphorus, arsenic, antimony, and bismuth but is not limited thereto.

As used herein, "Group VI" refers to Group VIA and may include sulfur, selenium, and tellurium, but is not limited thereto.

As used herein, the term "first absorption peak wavelength" refers to a wavelength of a main excitonic peak appearing first from the longest wavelength region of a UV-vis absorption spectrum of a quantum dot (i.e., appearing in the lowest energy region in the UV-Vis absorption spectrum).

A semiconductor nanocrystal particle (also referred to as a quantum dot) is a nano-sized crystalline material. The semiconductor nanocrystal particle may have a large surface area per unit volume due to a relatively small size of the semiconductor nanocrystal particle and may exhibit different characteristics from bulk materials having the same composition due to a quantum confinement effect. Quantum dots may absorb light from an excitation source to be excited, and may emit energy corresponding to an energy bandgap of the quantum dots.

The quantum dots have potential applicability in various devices (e.g., an electronic device) due to unique photoluminescence characteristics of the quantum dots.

Quantum dots having properties applicable to an electronic device may be cadmium-based. However, cadmium may cause a serious environment/health problem and thus is a restricted element. As a type of cadmium free quantum dot, a Group III-V-based nanocrystal has been extensively researched. However, cadmium free quantum dots have technological drawbacks in comparison with cadmium based quantum dots. When the cadmium free quantum dots undergo various processes for being applied to an electronic device, the cadmium free quantum dots may exhibit sharply deteriorated luminous properties.

For example, for their application in a device, quantum dots often use blue light (e.g., having a wavelength of about 450 nm) as excitation energy source. The cadmium based quantum dots generally have a high level of blue light absorption. However, in the case of cadmium free quantum dots, the absorption strength for blue light (e.g., having a wavelength of about 450 nm) may not be not high, which may lead to a decreased brightness.

In a cadmium free quantum dot, introduction of a core-shell structure may contribute to securing, e.g., providing, a luminous property and stability. For example, an InP based core may be passivated with a ZnSe/ZnS shell of an increased thickness to be applied in a quantum dot pattern production. However, the present inventors have found that an increased thickness of a shell may be desirable to achieve an appropriate level of stability and luminous property while the increase in the shell thickness may also cause a sharp increase in a weight of each quantum dot, which may lead to a decrease in the number of quantum dots per a given weight and may cause a decrease in an excitation light absorption of a quantum dot-polymer composite.

When the quantum dot is used in a patterned film such as a color filter, the decrease in the excitation light absorption may be a direct cause of a blue light leakage in a display device, may adversely affect a color gamut (e.g., a coverage rate under a DCI standard), and may result in a decrease of a luminous efficiency.

The quantum dot of an embodiment may include the structure and composition that will be described below and may have enhanced luminous properties and stability even when it does not include cadmium and thus when it is prepared in a composite form, the quantum dot of an embodiment may provide relatively high absorption (e.g., a ratio of the absorbance intensity at 450 nm with respect to the absorbance intensity at 350 nm).

Accordingly, a quantum dot of an embodiment does not include cadmium. The quantum dot includes a semiconductor nanocrystal core including indium (In) and phosphorous (P), a first semiconductor nanocrystal shell disposed on the semiconductor nanocrystal core and including zinc and selenium, and a second semiconductor nanocrystal shell disposed on the first semiconductor nanocrystal shell and including zinc and sulfur. In an embodiment, the quantum dot may have a core-multi-layered shell structure. For example, the quantum dot may include a core including an indium phosphide (e.g., InP or InZnP), a first shell directly on the core and including ZnSe, and a second shell directly on the first shell, having a different composition from the first shell, and including ZnS. In an embodiment, the quantum dot does not include an alkane monothiol compound on a surface thereof.

In a quantum dot of an embodiment, a molar ratio of sulfur with respect to selenium may be less than or equal to about 2.5:1. In a quantum dot of an embodiment (e.g., emitting green or red light), a molar ratio of sulfur with respect to selenium may be less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, less than or equal to about 0.9:1, or less than or equal to about 0.8:1, less than or equal to about 0.7:1, or less than or equal to about 0.6:1. In a quantum dot of an embodiment, a molar ratio of sulfur with respect to selenium may be greater than or equal to about 0.05:1, greater than or equal to about 0.07:1, greater than or equal to about 0.1:1, greater than or equal to about 0.2:1, greater than or equal to about 0.3:1, greater than or equal to about 0.4:1, or greater than or equal to about 0.5:1.

In an embodiment, the quantum dot may emit green light and may have a molar ratio of sulfur with respect to selenium that is greater than or equal to about 0.05:1, greater than or equal to about 0.07:1, greater than or equal to about 0.1:1, greater than or equal to about 0.2:1 (for example, greater than or equal to about 0.3:1) and less than or equal to about 1.5:1 (for example, less than or equal to about 1.4:1, less than or equal to about 1.3:1, less than or equal to about 1.2:1, less than or equal to about 1.1:1, less than or equal to about 1:1, less than or equal to about 0.9:1, less than or equal to about 0.8:1, less than or equal to about 0.7:1, or less than or equal to about 0.6:1).

In an embodiment, the quantum dot may emit red light and may have a molar ratio of sulfur with respect to selenium that is greater than or equal to about 0.1:1, greater than or equal to about 0.2:1, greater than or equal to about 0.3:1 (or greater than or equal to about 0.4:1) and less than or equal to about 2:1 (for example, less than or equal to about 1.9:1, less than or equal to about 1.8:1, less than or equal to about 1.7:1, less than or equal to about 1.6:1, less than or equal to about 1.5:1, less than or equal to about 1.4:1, or less than or equal to about 1.3:1).

In an embodiment of a quantum dot (emitting green or red light), a mole ratio of zinc with respect to indium may be less than or equal to about 50:1, less than or equal to about 49:1, less than or equal to about 48:1, less than or equal to about 47:1, or less than or equal to about 46:1, less than or equal to about 45:1, for example, less than or equal to about 44:1, less than or equal to about 40:1, less than or equal to about 35:1, less than or equal to about 30:1, less than or equal to about 25:1, less than or equal to about 20:1, less than or equal to about 15:1, or less than or equal to about 10:1.

In an embodiment of a quantum dot (emitting green or red light), a mole ratio of zinc with respect to indium may be greater than or equal to about 3:1, greater than or equal to about 4:1, greater than or equal to about 5:1, greater than or equal to about 6:1, greater than or equal to about 7:1, greater than or equal to about 8:1, greater than or equal to about 9:1, greater than or equal to about 10:1, greater than or equal to about 15:1, greater than or equal to about 20:1, greater than or equal to about 25:1, greater than or equal to about 30:1, greater than or equal to about 35:1, greater than or equal to about 40:1, or greater than or equal to about 43:1.

The aforementioned range of the molar ratio may contribute to an increased level of a blue light absorption rate of the quantum dot emitting green or red light.

In an embodiment, the quantum dot has a maximum photoluminescent peak in a range of about 500 nm to about 550 nm and the molar ratio of the sulfur with respect to the selenium may be greater than or equal to about 0.1 and less than or equal to about 1 and/or a molar ratio of zinc with respect to indium may be less than or equal to about 48:1, less than or equal to about 47:1, less than or equal to about 46:1, less than or equal to about 45:1, less than or equal to about 44:1 (or less than or equal to about 35:1) and/or greater than or equal to about 5 (or greater than or equal to about 6:1, greater than or equal to about 7:1, greater than or equal to about 8:1, greater than or equal to about 9:1, greater than or equal to about 10:1, greater than or equal to about 20:1, greater than or equal to about 30:1, greater than or equal to about 35, greater than or equal to about 40, or greater than or equal to about 44).

In an embodiment, the quantum dot has a maximum photoluminescent peak in a range of about 600 nm to about 650 nm and the molar ratio of the sulfur with respect to the selenium may be greater than or equal to about 0.2:1 and less than or equal to about 2:1 and/or a molar ratio of zinc with respect to indium may be less than or equal to about 30:1, less than or equal to about 28:1, less than or equal to about 25:1, less than or equal to about 20:1 and/or greater than or equal to about 3, greater than or equal to about 4:1, greater than or equal to about 5:1, greater than or equal to about 6:1, greater than or equal to about 7:1, greater than or equal to about 8:1, or greater than or equal to about 9:1.

The first semiconductor nanocrystal shell may include ZnSe. The first semiconductor nanocrystal shell may not include sulfur (S), e.g., may be free of S or have no S added. For example, the first semiconductor nanocrystal shell may not include, e.g., may be free of, ZnSeS. The first semiconductor nanocrystal shell may be disposed directly on the semiconductor nanocrystal core. The first semiconductor nanocrystal shell may have a thickness of greater than or equal to about 3 monolayers (ML), for example, greater than or equal to about 3.5 ML, greater than or equal to about 3.6 ML, greater than or equal to about 3.7 ML, greater than or equal to about 3.8 ML, greater than or equal to about 3.9 ML, or greater than or equal to about 4 ML. The first semiconductor nanocrystal shell may have a thickness of less than or equal to about 9 ML, less than or equal to about 8 ML, less than or equal to about 7 ML, less than or equal to about for example, 6 ML, or less than or equal to about 5 ML. In an embodiment, the first semiconductor nanocrystal shell may have a thickness of greater than or equal to about 0.9 nm, greater than or equal to about 1 nm, greater than or equal to about 1.1 nm, greater than or equal to about 1.2 nm, greater than or equal to about 1.5 nm, greater than or equal to about 1.8 nm and less than or equal to about 3 nm, less than or equal to about 2.7 nm, less than or equal to about 2.5 nm, less than or equal to about 2.2 nm, less than or equal to about 1.4 nm, less than or equal to about 1.3 nm, or less than or equal to about 1.25 nm.

The second semiconductor nanocrystal shell may include ZnS. The second semiconductor nanocrystal shell may not include selenium. The second semiconductor nanocrystal shell may be disposed directly on the first semiconductor nanocrystal shell. The second semiconductor nanocrystal shell may be an outermost layer of the quantum dot. A thickness of the second semiconductor nanocrystal shell may be less than 0.7 nm, for example, less than or equal to about 0.65 nm, less than or equal to about 0.64 nm, less than or equal to about 0.63 nm, less than or equal to about 0.62 nm, less than or equal to about 0.61 nm, or less than or equal to about 0.6 nm. A thickness of the second semiconductor nanocrystal shell may be greater than or equal to about 0.15 nm, greater than or equal to about 0.16 nm, greater than or equal to about 0.17 nm, greater than or equal to about 0.18 nm, greater than or equal to about 0.19 nm, greater than or equal to about 0.2 nm, greater than or equal to about 0.21 nm, greater than or equal to about 0.22 nm, greater than or equal to about 0.23 nm, greater than or equal to about 0.24 nm, greater than or equal to about 0.25 nm, greater than or equal to about 0.26 nm, or greater than or equal to about 0.27 nm.

In an embodiment, the quantum dot emits green light and a thickness of the second semiconductor nanocrystal shell may be greater than or equal to about 0.15 nm, greater than or equal to about 0.16 nm, greater than or equal to about 0.17 nm, greater than or equal to about 0.18 nm, greater than or equal to about 0.19 nm, or greater than or equal to about 0.2 nm and less than or equal to about 0.55 nm, less than or equal to about 0.5 nm, less than or equal to about 0.45 nm, or less than or equal to about 0.4 nm.

In an embodiment, the quantum dot emits red light and a thickness of the second semiconductor nanocrystal shell may be greater than or equal to about 0.2 nm, or greater than or equal to about 0.25 nm and less than or equal to about 0.69 nm, less than or equal to about 0.6 nm, less than or equal to about 0.55 nm, or less than or equal to about 0.5 nm.

The present inventors have found that the adoption of the aforementioned shell(s) may makes it possible for the quantum dot of an embodiment to provide a quantum dot-polymer composite having enhanced excitation light absorbance and increased luminous efficiency. For example, in the quantum dot of an embodiment, the thickness of the first semiconductor nanocrystal shell (e.g., based on the zinc selenide) within the aforementioned range may have a favorable effect on the increase of the luminous efficiency of the quantum dot. The thickness of the second semiconductor nanocrystal shell (e.g., based on the zinc sulfide) within the aforementioned range can make it possible, for example, for a quantum dot-polymer composite film including the quantum dot to maintain an excitation light (e.g., a blue light) absorbance at an enhanced, e.g., improved, level without adversely affecting the luminous efficiency thereof.

The quantum dots of an embodiment may include the shell of the aforementioned structure and composition and may exhibit a high level of chemical stability. As a result, even when the quantum dots of an embodiment undergo a preparation process for a composition including them (that involves many contacts with various chemicals such as an organic polymer, an organic solvent, and various additives) or a production process for a composite (or a pattern thereof) using the composition, the resulting composition or the resulting composite may show an increased luminous properties.

Accordingly, a quantum dot of an embodiment may have a quantum efficiency of greater than or equal to about 65%, for example, greater than or equal to about 66%, or greater than or equal to about 67%, greater than or equal to about 68%, greater than or equal to about 69%, or greater than or equal to about 70%. A quantum dot of an embodiment may have a ratio of absorbance (intensity) at 450 nm with respect to absorbance at 350 nm that is greater than or equal to about 0.08:1 in a UV-Vis absorption spectrum.

For example, the quantum dot of an embodiment may emit green light and a ratio of absorbance (intensity) at 450 nm with respect to absorbance at 350 nm may be greater than or equal to about 0.085:1, greater than or equal to about 0.09:1, or greater than or equal to about 0.1:1. In an embodiment, the quantum dot may emit red light and a ratio of absorbance (intensity) at 450 nm with respect to absorbance at 350 nm may be greater than or equal to about 0.11:1, greater than or equal to about 0.12:1, or greater than or equal to about 0.13:1. A center wavelength of the green light may be in a range of about 500 nm to about 550 nm, and a center wavelength of the red light may be in a range of about 600 to about 650 nm.

The light absorbance at about 350 nm for the quantum dot may reflect absorption of the first semiconductor nanocrystal shell (e.g., ZnSe) and the second semiconductor nanocrystal shell (e.g., ZnS) for example, which may depend on a size thereof. The light absorbance at about 450 nm may represent absorption of blue light, e.g., from a blue light source, that is provided with a device including a quantum dot based color filter. In the UV-Vis absorption spectrum of the quantum dot, a ratio of light absorbance at 450 nm with respect to light absorbance at about 350 nm may represent a blue light source absorption ability of the quantum dot depending on a shell volume of the quantum dot of an embodiment. In case of the quantum dot having the aforementioned shell composition, as the ratio of light absorbance at 450 nm with respect to light absorbance at about 350 nm increases, a film including the quantum dot may exhibit a high level of blue light absorbance.

In an embodiment, the quantum dot-polymer composite may have a 450 nm wavelength blue light absorption rate of greater than or equal to about 89%, for example, greater than or equal to about 90%, greater than or equal to about 91%, greater than or equal to about 92%, or greater than or equal to about 93% when it is in the form of a film with a thickness of about 6 um and an amount of the quantum dots is less than or equal to about 45%, based on a total weight of the composite.

In an embodiment, the semiconductor nanocrystal core may further include zinc. The semiconductor nanocrystal core may include InP or InZnP. The size of the core may be selected appropriately in light of a photoluminescence wavelength thereof. For example, the size of the core may be greater than or equal to about 1 nm, greater than or equal to about 1.5 nm, greater than or equal to about 2 nm. For example, the size of the core may be less than or equal to about 5 nm, less than or equal to about 4 nm, or less than or equal to about 3 nm.

When a maximum luminous peak wavelength of the quantum dot is present in a range of about 500 nm to about 550 nm, a size of the semiconductor nanocrystal core may be greater than or equal to about 1 nm (for example, greater than or equal to about 2 nm) and less than or equal to about 2.7 nm (for example, less than or equal to about 2.5 nm). When a maximum luminous peak wavelength of the quantum dot is present in a range of about 600 nm to about 650 nm, a size of the semiconductor nanocrystal core may be greater than or equal to about 2 nm (for example, greater than or equal to about 3 nm) and less than or equal to about 5 nm (for example, less than or equal to about 4 nm).

As used herein, a term regarding a dimension (for example, about a quantum dot related dimension such as a size) may also refer to an average dimension (e.g., an average size).

A quantum dot-based display device may exhibit improved color purity, luminance, and the like. For example, a liquid crystal display (hereinafter, LCD) realizes colors by polarized light passing an absorption type color filter after passing a liquid crystal. LCDs have a drawback of a narrow viewing angle and low light transmittance due to the absorption type color filter. A quantum dot may emit light having theoretical quantum efficiency or quantum yield (QY) of about 100% and high color purity (e.g., less than or equal to about 40 nm of a full width at half maximum (FWHM)) and thus achieve increased luminous efficiency and improved color reproducibility. The absorption type color filter may be replaced with a photoluminescent type color filter including the quantum dot to realize a wider viewing angle and improved luminance.

The quantum dot may be dispersed in a host matrix (e.g., including a polymer, an inorganic material, or a combination thereof) to form a composite and thus be applied it to a device. The quantum dot according to an embodiment has improved optical properties and process stability, and accordingly, when included in a display device as a quantum dot-polymer composite or a patterned form including a quantum dot-polymer composite, improved luminance, a wide viewing angle, and improved color reproducibility may be realized. However, the weight of the quantum dot included in the composite may be limited for various reasons regarding a production process. Thus, developing a quantum dot exhibiting enhanced blue light absorption and increased brightness at the same time and having thermal stability is desired.

As explained above, the quantum dot of an embodiment may include a shell, e.g., coating, and the aforementioned structure and composition, a single quantum dot may have a relatively reduced weight and thus the number of the quantum dots included in a given weight may increase, and one or more qualities of the quantum dot may be improved. In addition, the quantum dot of an embodiment may show an improved stability (e.g., thermal stability) and enhanced optical properties (e.g., quantum efficiency and blue light absorption rate). Accordingly, the quantum dots may be used in a photoluminescent type color filter.

In case of emitting a red light, the quantum dot of an embodiment may have a molar ratio of the indium with respect to (a total moles of) the sulfur and the selenium (In/Se+S, hereinafter, also referred to as a molar ratio of indium to sulfur and selenium) of greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, or greater than or equal to about 0.20:1. The quantum dot of an embodiment emitting a red light may have a molar ratio of indium to sulfur and selenium that is less than or equal to about 0.26:1, less than or equal to about 0.25:1, or less than or equal to about 0.22:1.

In an embodiment, the quantum dot may include an InZnP core, emitting a green light, and may have a molar ratio of indium to sulfur and selenium that is greater than or equal to about 0.04:1 or greater than or equal to about 0.05:1 and less than or equal to about 0.18:1 or less than or equal to about 0.16:1.

In the UV-Vis absorption spectrum of the quantum dot, the first absorption peak wavelength may be greater than or equal to about 450 nm and less than or equal to about the photoluminescent peak wavelength of the quantum dot. For example, in case of the green light emitting quantum dot, the first absorption peak wavelength may be for example, greater than or equal to about 480 nm, greater than or equal to about 485 nm, greater than or equal to about 490 nm, or greater than or equal to about 495 nm and less than or equal to about 520 nm, less than or equal to about 515 nm, less than or equal to about 510 nm, or less than or equal to about 505 nm. In an embodiment, in case of the red light emitting quantum dot, the first absorption peak wavelength may be for example, greater than or equal to about 580 nm, greater than or equal to about 590 nm, greater than or equal to about 595 nm and less than or equal to about 620 nm, less than or equal to about 610 nm, or less than or equal to about 600 nm.

When it emits a green or red light, a size (or an average size, hereinafter referred to as a size) of the quantum dot may be greater than or equal to about 1 nm, greater than or equal to about 2 nm, greater than or equal to about 3 nm, greater than or equal to about 4 nm, or greater than or equal to about 5 nm. When it emits a green or red light, a size of the quantum dot may be less than or equal to about 30 nm, for example, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, or less than or equal to about 7 nm.

The size of the quantum dot may be a particle diameter. The size of the quantum dot may be a particle diameter, or in the case of a non-spherically shaped particle, the size of the quantum dot may be calculated by converting a (e.g., two-dimensional) area of an electron microscopic image of the particle into a circle (e.g., an equivalent circle area).

In an embodiment, the quantum yield of the quantum dot may be greater than or equal to about 60%, greater than or equal to about 65%, greater than or equal to about 70%, greater than or equal to about 72%, greater than or equal to about 75%, or greater than or equal to about 80%. In an embodiment, a full width at half maximum of a maximum luminescent peak of the quantum dot may be less than or equal to about 45 nm, for example, less than or equal to about 44 nm, less than or equal to about 43 nm, less than or equal to about 42 nm, less than or equal to about 41 nm, or less than or equal to about 40 nm.

A shape of the quantum dot is not particularly limited, and may for example be a spherical, polyhedron, pyramid, multipod, or cube shape, nanotube, nanowire, nanofiber, nanosheet, or a combination thereof, but is not limited thereto.

The quantum dot may include the organic ligand, the organic solvent, or a combination thereof, which will be described below, on a surface of the quantum dot. The organic ligand, the organic solvent, or a combination thereof may be bound to the surface of the quantum dot.

In an embodiment, a method of producing the aforementioned quantum dot includes:
obtaining a first mixture including a first shell precursor containing zinc, an organic ligand, and an organic solvent;
optionally heating the first mixture;
injecting a semiconductor nanocrystal core including indium and phosphorous and a selenium containing precursor to the (optionally heated) first mixture to obtain a second mixture;
heating the second mixture at a first temperature and keeping the same at the first reaction temperature for at least about 40 minutes, for example, at least about 50 minutes to obtain a third mixture including a particle including a first semiconductor nanocrystal shell including zinc and selenium formed on the semiconductor nanocrystal core;
injecting a sulfur containing precursor (e.g., a stock solution including the sulfur containing precursor) into the third mixture at the first reaction temperature and carrying out a reaction to form a second semiconductor nanocrystal shell on the first semiconductor nanocrystal shell,
wherein an amount of the selenium containing precursor and an amount of the sulfur containing precursor with respect to the core in the second mixture and the third mixture are controlled respectively (and optionally controlling a duration of a reaction in each step) in order for a resulting quantum dot to satisfy the aforementioned shell composition.

The semiconductor nanocrystal core, the selenium containing precursor, or a combination thereof may be injected as a stock solution with no heating.

Details of the quantum dot, the semiconductor nanocrystal core, the first semiconductor nanocrystal shell, and the second semiconductor nanocrystal shell are the same as set forth above.

The zinc precursor is not particularly limited and may be selected appropriately. In an embodiment, the zinc precursor may include a Zn metal powder, an alkylated Zn compound (e.g., dimethyl zinc, diethyl zinc, or a combination thereof), a Zn alkoxide, a Zn carboxylate (e.g., zinc acetate), a zinc carbonate, a Zn nitrate, a Zn perchlorate, a Zn sulfate, a Zn acetylacetonate, a Zn halide (e.g., zinc chloride, zinc bromide, zinc iodide, zinc fluoride, or a combination thereof), a Zn carbonate, a Zn cyanide, a Zn hydroxide, a Zn oxide, a Zn peroxide, or a combination thereof.

Examples of the first shell precursor may include, but are not limited to dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. The zinc containing precursor may be used alone or in a combination of two or more compounds.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, RHPOOH (wherein R and R' are the same or different, and are independently a hydrogen, a C1 to C40 (or C3 to C24) aliphatic hydrocarbon group (e.g., a alkyl group, a alkenyl group, or a alkynyl group), a C6 to C40 aromatic hydrocarbon group (such as a C6 to C20 aryl group), a polymeric organic ligand, or a combination thereof.

The organic ligand may coordinate to, e.g., be bound to, the surface of the obtained nanocrystal and help the nanocrystal to be well dispersed in the solution, may affect light emitting and/or electrical characteristics of quantum dots.

Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, or substituted or unsubstituted octylphosphine (e.g., trioctylphosphine (TOP)); phosphine oxide such as substituted or unsubstituted methyl phosphine oxide (e.g., trimethyl phosphine oxide, methyldiphenyl phosphine oxide, etc.), substituted or unsubstituted ethyl phosphine oxide (e.g., triethyl phosphine oxide, ethyldiphenyl phosphine oxide, etc.), substituted or unsubstituted propyl phosphine oxide, substituted or unsubstituted butyl phosphine oxide, or substituted or unsubstituted octyl phosphine oxide (e.g., trioctylphosphine oxide (TOPO); diphenyl phosphine, triphenyl phosphine, diphenyl phosphine oxide, or triphenyl phosphine oxide; an alkylphosphinic acid for example, a C5 to C20 alkyl phosphinic acid (e.g., hexyl phosphinic acid, octyl phosphinic acid, dodecanyl phosphinic acid, tetradecanyl phosphinic acid, hexadecanyl phosphinic acid, octadecanyl phosphinic acid, or the like, an alkylphosphonic acid such as a C5 to C20 alkylphosphonic acid; or the like, but are not limited thereto. The organic ligand may be used alone or as a mixture of at least two ligand compounds.

The organic solvent may a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine, a phosphine oxide substituted with a C6 to C22 alkyl group such as trioctylphosphine oxide; a C12 to C22 aromatic ether such as phenyl ether, or benzyl ether, or a combination thereof. Types and amounts of the organic solvent may be appropriately selected considering precursors and organic ligands.

The first mixture may be heated to a predetermined temperature (e.g., of greater than or equal to about 100° C., for example, greater than or equal to about 120° C., greater than or equal to about 150° C., greater than or equal to about 200° C., greater than or equal to about 250° C., or greater than or equal to about 270° C.) and less than or equal to about the first reaction temperature under vacuum, an inert atmosphere, or a combination thereof.

Details of the semiconductor nanocrystal core including indium and phosphorous are the same as above. The core may be commercially available or may be prepared in any appropriate method. The preparation of the core is not particularly limited and may be performed in any method of producing an indium phosphide based core. In an embodiment, the core may be synthesized in a hot injection manner wherein a solution including a metal precursor (e.g., an indium precursor) and optionally a ligand is heated at a high temperature (e.g., of greater than or equal to about 200° C.) and then a phosphorous precursor is injected the heated hot solution.

The selenium precursor is not particularly limited and may be desirably selected. In an embodiment, the selenium precursor includes selenium-trioctyl phosphine (Se-TOP), selenium-tributyl phosphine (Se-TBP), selenium-triphenyl phosphine (Se-TPP), tellurium-tributylphosphine (Te-TBP), or a combination thereof but is not limited thereto.

The first reaction temperature may be selected appropriately and, for example, may be greater than or equal to about 280° C., greater than or equal to about 290° C., greater than or equal to about 300° C., greater than or equal to about 310° C., or greater than or equal to about 315° C. and less than or equal to about 390° C., less than or equal to about 380° C., less than or equal to about 370° C., less than or equal to about 360° C., less than or equal to about 350° C., less than or equal to about 340° C., or less than or equal to about 330° C.

After or during the heating to the first reaction temperature, a selenium containing precursor may be injected at least one time (e.g., at least twice, at least third times).

The reaction time (keeping the second mixture at the first reaction temperature) may be greater than or equal to about 40 minutes, for example, greater than or equal to about 50 minutes, greater than or equal to about 60 minutes, greater than or equal to about 70 minutes, greater than or equal to about 80 minutes, greater than or equal to about 90 minutes, and less than or equal to about 4 hours, for example, less than or equal to about 3 hours, less than or equal to about 2 hours.

By the reaction at the first reaction temperature for the aforementioned time period, the first semiconductor nanocrystal shell including the zinc and the selenium and having a thickness of greater than or equal to about 3 ML may be formed to provide the third mixture.

In this case, in the second mixture, the amount of the selenium precursor with respect to the indium may be controlled such that during the predetermined reaction time, the first semiconductor nanocrystal shell having the predetermined thickness may be formed. In an embodiment, the amount of the selenium per one mole of indium may be greater than or equal to about 7 moles, greater than or equal to about 8 moles, greater than or equal to about 9 moles, or greater than or equal to about 10 moles, but is not limited there to. In an embodiment, the amount of the selenium per one mole of indium may be less than or equal to about 20 moles, less than or equal to about 18 moles, or less than or equal to about 15 moles, but is not limited thereto.

The third mixture may not include the selenium containing precursor.

At the first reaction temperature, a stock solution including a sulfur containing precursor is added to the third mixture to form a second semiconductor nanocrystal shell on the first semiconductor nanocrystal shell.

In an embodiment, the method does not include lowering a temperature of the third mixture down at or below about 100° C., for example, less than or equal to about 50° C. (e.g., 30° C. or lower, or room temperature). In other words, the method may include maintaining a temperature of a reaction mixture including the particle having the first semiconductor nanocrystal shell on the core at a temperature of greater than or equal to 100° C., for example, greater than or equal to 50° C., greater than or equal to 30° C.

Types of the sulfur containing precursor are not particularly limited and may be selected appropriately. The sulfur containing precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfide, sulfide ammonium, sodium sulfide, or a combination thereof. The sulfur containing precursor may be injected at least one times (e.g., at least two times).

The duration for the formation of the second shell may be greater than or equal to about 5 minutes, greater than or equal to about 10 minutes, greater than or equal to about 15 minutes, greater than or equal to about 20 minutes, or greater than or equal to about 25 minutes and less than or equal to about 1 hour, less than or equal to about 50 minutes, less than or equal to about 45 minutes, or less than or equal to about 40 minutes.

In an embodiment, an amount of sulfur with respect to one mole of indium in the third mixture may be controlled to obtain a desired shell composition (for example, such that the thickness thereof is less than or equal to about 0.7 nm) considering the reactivity of the precursor and the reaction temperature. For example, the amount of sulfur with respect to one mole of indium in the third mixture may be greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. The amount of sulfur with respect to one mole of indium in the third mixture may be, less than or equal to about 45 moles, less than or equal to about 40 moles, less than or equal to about 35 moles, less than or equal to about 30 moles, less than or equal to about 25 moles, less than or equal to about 20 moles, less than or equal to about 19 moles, less than or equal to about 18 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, or less than or equal to about 5 moles.

After the reaction, a non-solvent is added into the obtained final reaction solution, and thereby organic ligand-coordinated quantum dots may be separated (e.g., precipitated). The non-solvent may be a polar solvent that is miscible with the solvent used in the reaction and nanocrystals are not dispersible therein. The non-solvent may be selected depending on the solvent used in the reaction and may be for example, acetone, ethanol, butanol, isopropanol, ethanediol, water, tetrahydrofuran (THF), dimethyl sulfoxide (DMSO), diethyl ether, formaldehyde, acetaldehyde, a solvent having a similar solubility parameter to the foregoing solvents, or a combination thereof. The separation may be performed through a centrifugation, precipitation, chromatography, or distillation. The separated nanocrystal may be added to a washing solvent and washed, if desired. The washing solvent is not particularly limited and may include a solvent having a similar solubility parameter to that of the ligand and may, for example, include hexane, heptane, octane, chloroform, toluene, benzene, and the like.

The quantum dots may be dispersed in a dispersing solvent. The quantum dots may form an organic solvent dispersion. The organic solvent dispersion may be free of water, may be free of a water miscible organic solvent, or a combination thereof. The dispersing solvent may be selected appropriately. The dispersing solvent may include (or consists of) the aforementioned organic solvent. The dispersing solvent may include (or consists of) a substituted or unsubstituted C1 to C40 aliphatic hydrocarbon, a substituted or unsubstituted C6 to C40 aromatic hydrocarbon, or a combination thereof.

In an embodiment, a composition includes: (for example, a plurality of) the aforementioned quantum dot(s); a dispersing agent; and an organic solvent, a liquid vehicle, or a combination thereof. The dispersing agent may disperse the quantum dots and may include a carboxylic acid group containing a binder. The composition may further include a polymerizable (e.g., photopolymerizable) monomer including a carbon-carbon double bond; and optionally an initiator (e.g., a photoinitiator or a thermal initiator). The composition may be photosensitive.

In the composition, details for the quantum dots are the same as set forth above. In the composition, the amount of the quantum dot may be selected appropriately in light of the types and amounts of other components in the composition and a final use thereof. In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total solid content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total solid content of the composition. A weight percent of a component, based on a total solid content of the composition, may represent the amount of the component in the composite, which will be described below.

The composition of an embodiment may be used for providing a pattern including a quantum dot-polymer composite. In an embodiment, the composition may be a photoresist composition that may be applicable to a photolithography process. In other embodiments, the composition may be an ink composition that may be applicable to an ink jet process (e.g., a liquid drop discharging method such as an ink jet printing). In an embodiment, the composition may not include a conjugated polymer (except for a cardo binder that will be described below). In an embodiment, the composition may include a conjugated (or electrically conductive) polymer. As used herein, the conjugated polymer may be a polymer including a conjugated double bond such as a polyphenylene vinylene.

In the composition of an embodiment, a dispersing agent is a compound capable of securing, e.g., improving, a dispersibility of the quantum dots. The dispersing agent may be a binder polymer. The binder polymer may include a carboxylic acid group (for example, in repeating units of the binder polymer). The binder polymer may be an (electrically) insulative polymer.

In an embodiment, the binder polymer may include:
a copolymer of a monomer combination including a first monomer, a second monomer, and optionally a third monomer, the first monomer including a carboxylic acid group and a carbon-carbon double bond, the second monomer including a carbon-carbon double bond and a hydrophobic moiety and not including a carboxylic acid group, and the third monomer including a carbon-carbon double bond and a hydrophilic moiety and not including a carboxylic acid group;

a multi-aromatic ring-containing polymer including a carboxylic acid group (—COOH) and including a backbone structure in a main chain (e.g., a backbone structure incorporated in the main chain), wherein the backbone structure includes a cyclic group including a quaternary carbon atom and two aromatic rings bound to the quaternary carbon atom (e.g., also known as a cardo binder);

or a combination thereof.

The copolymer may include a first repeating unit derived from the first monomer, a second repeating unit derived from the second monomer, and optionally a third repeating unit derived from the third monomer.

Examples of the first monomer may include, but are not limited to, acrylic acid, methacrylic acid, maleic acid, itaconic acid, fumaric acid, 3-butenoic acid, and other carboxylic acid vinyl ester compounds. The first monomer may include one or more compounds.

Examples of the second monomer may include, but are not limited to:

alkenyl aromatic compounds such as styrene, α-methyl styrene, vinyl toluene, or vinyl benzyl methyl ether;

unsaturated carboxylic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;

unsaturated carboxylic acid amino alkyl ester compounds such as 2-amino ethyl acrylate, 2-amino ethyl methacrylate, 2-dimethyl amino ethyl acrylate, or 2-dimethyl amino ethyl methacrylate;

maleimides such as N-phenylmaleimide, N-benzylmaleimide, or N-alkylmaleimide, unsaturated carboxylic acid glycidyl ester compounds such as glycidyl acrylate or glycidyl methacrylate;

vinyl cyanide compounds such as acrylonitrile or methacrylonitrile; and unsaturated amide compounds such as acrylamide or methacrylamide, but are not limited thereto.

As the second monomer, one or more compounds may be used.

If present, examples of the third monomer may include 2-hydroxy ethyl acrylate, 2-hydroxy ethyl methacrylate, hydroxy propyl acrylate, hydroxy propyl methacrylate, 2-hydroxy butyl acrylate, and 2-hydroxy butyl methacrylate, but are not limited thereto. The third monomer may include one or more compounds.

In an embodiment, in the binder polymer, an amount of the first repeating unit, the second repeating unit, or a combination thereof may be greater than or equal to about 5 mole percent (mol %), for example, greater than or equal to about 10 mol %, greater than or equal to about 15 mol %, greater than or equal to about 25 mol %, or greater than or equal to about 35 mol %. In the binder polymer, an amount of the first repeating unit, the second repeating unit, or a combination thereof may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

If present, in the binder polymer, an amount of a third repeating unit derived from the third monomer, when present, may be greater than or equal to about 1 mol %, for example, greater than or equal to about 5 mol %, greater than or equal to about 10 mol %, or greater than or equal to about 15 mol %. In the binder polymer, an amount of the third repeating unit, when present, may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

In an embodiment, the binder polymer may include a multi-aromatic ring-containing polymer. The multi-aromatic ring-containing polymer is also known as a cardo binder, which may be commercially available.

The carboxylic acid group-containing binder may have an acid value of greater than or equal to about 50 milligrams of potassium hydroxide per gram (mg KOH/g). For example, the carboxylic acid group-containing binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g, but is not limited thereto. The carboxylic acid group-containing binder may have an acid value of less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The binder polymer (e.g., containing the carboxylic acid group, such as the carboxylic acid group-containing binder) may have a weight (or a number) average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a weight (or a number) average molecular weight of less than or equal to about 100,000 g/mol, for example, less than or equal to about 50,000 g/mol, less than or equal to about 25,000 g/mol, or less than or equal to about 10,000 g/mol.

In the composition, an amount of the dispersing agent (e.g., the binder polymer) may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight (or a total solid content) of the composition. In an embodiment, an amount of the carboxylic acid group-containing binder may less than or equal to about 50 wt %, less than or equal to about 40 wt %, less than or equal to about 35 wt %, less than or equal to about 33 wt %, or less than or equal to about 30 wt %, based on a total weight (or a total solid content) of the composition. The amount of the binder polymer may be greater than or equal to about 0.5 wt % and less than or equal to about 55%.

In the composition according to an embodiment, the (photo)polymerizable monomer including at least one (e.g., at least two, at least three, or more) carbon-carbon double bond may include a (e.g., photopolymerizable) (meth)acrylate monomer. The (photo)polymerizable monomer may be a precursor for an insulative polymer. Examples of the (photo)polymerizable monomer may include, but are not limited to, a C1-C10-alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

The amount of the (photo)polymerizable monomer may be greater than or equal to about 0.5 wt %, for example, greater than or equal to about 1 wt %, or greater than or equal to about 2 wt % with respect to a total weight (or a total solid content) of the composition. The amount of the photopolymerizable monomer may be less than or equal to about 50 wt %, for example, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % with respect to a total weight (or a total solid content) of the composition.

The (photo) initiator included in the composition may be for the polymerization of the (photo)polymerizable monomer. The initiator may be a compound that can generate a radical species under a mild condition (e.g., by light or heat) to promote the initiation of a radical reaction (e.g., a radical polymerization of a monomer). The initiator may be a thermal initiator or a photoinitiator. The initiator is not particularly limited and may be selected appropriately.

Examples of the thermal initiator may include azobisisobutyronitrile (AIBN), benzoyl peroxide (BPO) or the like but are not limited thereto.

The photoinitiator may be a compound that can initiate a radical polymerization of the aforementioned photopolymerizable (e.g., acryl based) monomer, a thiol compound that will be described below, or a combination thereof. The photoinitiator is not particularly limited. The photoinitiator may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, a carbazole compound, a diketone compound, a sulfonium borate compound, an azo compound (e.g., diazo compound), a biimidazole compound, or a combination thereof.

In the composition of an embodiment, an amount of the initiator may be adjusted in light of the types and the amount of the photopolymerizable monomer as used. In an embodiment, the amount of the initiator may be greater than or equal to about 0.01 wt % or greater than or equal to about 1 wt % and less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight (or a total solid content) of the composition, but is not limited thereto.

The (photosensitive) composition may further include a thiol compound (e.g., a monothiol compound or a multi-thiol compound having two or greater thiol groups), a metal oxide fine particle, or a combination thereof.

When a plurality of metal oxide fine particles is present in the polymer matrix, the metal oxide fine particles may include $TiO_2$, $SiO_2$, $BaTiO_3$, $Ba_2TiO_4$, ZnO, or a combination thereof. An amount of the metal oxide fine particle may be less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, less than or equal to about 5 wt %, based on a total weight (or a total solid content) of the composition. An amount of the metal oxide fine particle may be greater than or equal to about 1 wt %, greater than or equal to about 5 wt %, greater than or equal to about 10 wt %, based on a total weight (or a total solid content) of the composition.

A particle size of the metal oxide fine particles is not particularly limited and may be selected appropriately. The particle size of the metal oxide fine particles may be greater than or equal to about 100 nm, greater than or equal to about 150 nm, or greater than or equal to about 200 nm and less than or equal to about 1,000 nm, less than or equal to about 900 nm, or less than or equal to about 800 nm.

The multi-thiol compound may include a compound represented by Chemical Formula 1:

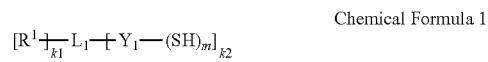

Chemical Formula 1 wherein, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group, wherein —NRR', wherein R and R' are independently hydrogen or C1 to C30 linear or branched alkyl group, but simultaneously not hydrogen; an isocyanate group; a halogen; —ROR', wherein R is a substituted or unsubstituted C1 to C20 alkylene group and R' is hydrogen or a C1 to C20 linear or branched alkyl group; an acyl halide, wherein —RC(═O)X, wherein R is a substituted or unsubstituted alkylene group and X is a halogen; —O(═O)OR', wherein R' is hydrogen or a C1 to C20 linear or branched alkyl group; —ON; —C(═O)NRR', wherein R and R' are independently hydrogen or a C1 to C20 linear or branched alkyl group; —C(═O)ONRR', wherein R and R' are independently hydrogen or a C1 to C20 linear or branched alkyl group; or a combination thereof, $L_1$ is a carbon atom, a substituted or unsubstituted C1 to C30 alkylene group, a substituted or unsubstituted C1 to C30 alkylene group wherein a methylene is replaced by a sulfonyl moiety, a carbonyl moiety, an ether moiety, a sulfide moiety, a sulfoxide moiety, an ester moiety, an amide moiety comprising hydrogen or a C1 to C10 alkyl group, or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond; a substituted or unsubstituted C1 to C30 alkylene group; a substituted or unsubstituted C2 to C30 alkenylene group; or a substituted or unsubstituted C1 to C30 alkylene group or a substituted or unsubstituted C2 to C30 alkenylene group wherein a methylene is replaced by a sulfonyl moiety, a carbonyl moiety, an ether moiety, a sulfide moiety, a sulfoxide moiety, an ester moiety, an amide moiety comprising hydrogen or a C1 to C10 linear or branched alkyl group, an imine moiety comprising hydrogen or a C1 to C10 linear or branched alkyl group, or a combination thereof, m is an integer of 1 or greater, k1 is 0 or an integer of 1 or greater, k2 is an integer of 1 or greater, and a sum of m and k2 is an integer of 3 or greater, provided that m does not exceed the valence of $Y_1$ and a sum of k1 and k2 does not exceed the valence of $L_1$.

The multi-thiol compound may include a dithiol compound, a trithiol compound, a tetrathiol compound, or a combination thereof. For example, the multi-thiol compound may include glycol di-3-mercaptopropionate (e.g., ethylene glycol di-3-mercaptopropionate), glycol dimercaptoacetate (e.g., ethylene glycol di mercaptoacetate), trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

Based on a total weight (or a total solid content) of the composition, an amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, or greater than or equal to about 15 wt %, based on a total weight (or a total solid content) of the composition.

The composition may further include an organic solvent, a liquid vehicle, or a combination thereof (hereinafter, simply referred to as "solvent"). The solvent is not particularly limited. Types and amounts of the solvent may be appropriately selected by considering the aforementioned main components (i.e., the quantum dot, the dispersing agent, the photopolymerizable monomer, the photoinitiator, and if used, the thiol compound), and types and amounts of additives which will be described below. The composition may include a solvent in a residual amount except for a desired amount of the solid content (non-volatile components).

The solvent may be appropriately selected by considering the other components (e.g., a binder, a photopolymerizable monomer, a photoinitiator, and other additives) in the composition, affinity for an alkali-developing solution, a boiling point, or the like. Non-limiting examples of the solvent and the liquid vehicle may include, but are not limited to: ethyl 3-ethoxy propionate; an ethylene glycol series such as ethylene glycol, diethylene glycol, or polyethylene glycol; a glycol ether such as ethylene glycol monomethyl ether, ethylene glycol monoethyl ether, diethylene glycol monomethyl ether, diethylene glycol diethyl ether, or diethylene glycol dimethyl ether; glycol ether acetates such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate such as propylene glycol monomethyl ether acetate or dipropylene glycol monoethyl ether acetate; an amide such as N-methylpyrrolidone, dimethyl formamide, or dimethyl acetamide; a ketone such as methyl ethyl ketone (MEK), methyl isobutyl ketone (MIBK), or cyclohexanone; a petroleum product such as toluene, xylene, or solvent naphtha; an ester such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

The composition may further include various additives such as a light diffusing agent, a leveling agent, or a coupling agent, in addition to the aforementioned components. The amount of the additive is not particularly limited, and may be selected within an appropriate range, wherein the additive does not cause an adverse effect on the preparation of the composition, the preparation of the quantum dot-polymer composite, and optionally, the patterning of the composite. Types and examples of the aforementioned additives may include any suitable compound having a desired function and are not particularly limited.

If present, the amount of the additives may be, based on a total weight of the composition (or a total solid content of the composition), greater than or equal to about 0.1 wt %, for example, greater than or equal to about 0.5 wt %, greater than or equal to about 1 wt %, greater than or equal to about 2 wt %, or greater than or equal to about 5 wt %, but it is not limited thereto. If present, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, but it is not limited thereto.

The composition according to an embodiment may be prepared by a method including: preparing quantum dot dispersion including the aforementioned quantum dots, the dispersing agent, and the solvent; and mixing the quantum dot dispersion with the initiator; the polymerizable monomer (e.g., acryl-based monomer); optionally the thiol compound; optionally the metal oxide particulate, and optionally the additives. Each component may be mixed sequentially or simultaneously, but a mixing order is not particularly limited.

The composition may provide a quantum dot-polymer composite or a quantum dot pattern via polymerization (e.g., photopolymerization).

In an embodiment, a quantum dot-polymer composite may include a polymer matrix; and the aforementioned quantum dots dispersed in the polymer matrix.

The polymer matrix may include at least one of a dispersing agent (e.g., a binder polymer including a carboxylic acid group), a polymerization product (e.g., insulating polymer) of a polymerizable monomer including a carbon-carbon double bond (at least one, for example, at least two, at least three, at least four, or at least five) optionally a polymerization product of the polymerizable monomer a multiple thiol compound including at least two thiol groups (e.g., at a terminal end of the multiple thiol compound), or a combination thereof, and a metal oxide particulate(s).

In an embodiment, the polymer matrix may include a cross-linked polymer and a dispersing agent (e.g., (carboxyl group-contained) binder polymer). The polymer matrix may not include a conjugated polymer (except for a cardo binder). The cross-linked polymer may include a thiolene resin, a cross-linked poly(meth)acrylate, or a combination thereof. In an embodiment, the cross-linked polymer may be a polymerization product of the polymerizable monomer and, optionally, the multiple thiol compound.

Details of the quantum dots, the dispersing agent, or the binder polymer, the polymerizable monomer, and the multiple thiol compound are the same as described above.

The film of the quantum dot-polymer composite or the quantum dot-polymer composite pattern that will be described below may have for example a thickness, less than or equal to about 30 μm, for example less than or equal to about 25 μm, less than or equal to about 20 μm, less than or equal to about 15 μm, less than or equal to about 10 μm, less than or equal to about 8 μm, less than or equal to about 7 μm and greater than about 2 μm, for example, greater than or equal to about 3 μm, greater than or equal to about 3.5 μm, greater than or equal to about 4 μm, greater than or equal to about 5 μm, or greater than or equal to about 6 μm.

In an embodiment, a patterned film includes a repeating section including a first section emitting first light, wherein the first section includes the quantum dot-polymer composite.

The repeating section may include a second section emitting second light having a different maximum peak wavelength from that of the first light. The second section may include a quantum dot-polymer composite. The quantum dot-polymer composite of the second section may include a second quantum dot configured to emit the second light. The second quantum dot may include the aforementioned quantum dot. The first light or the second light may be red light having a maximum photoluminescence peak wavelength which is present between about 600 nm and about 650 nm (e.g., about 620 nm to about 650 nm) or green light having a maximum photoluminescence peak wavelength which is present between about 500 nm and about 550 nm (e.g., about 510 nm to about 540 nm). The patterned film may further include a third section emitting or passing third light (e.g., blue light) different from the first light and the second light. The third light may have a maximum peak wavelength ranging from 380 nm to 480 nm.

In an embodiment, a display device includes a light source and a photoluminescence element, and the photoluminescence element includes a substrate and an emission layer disposed on the substrate, and the emission layer includes a film or patterned film of the quantum dot-polymer composite. The light source is configured to provide the photoluminescence element with incident light. The incident light may have a photoluminescence peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

In the emission layer (e.g., patterned film of quantum dot-polymer composite) of the device according to an embodiment, the first section may be a section emitting red light, and the second section may be a section emitting green light, and the light source may be an element emitting blue light.

An optical element (e.g., a blue light blocking layer or a first optical filter which will be described below) for blocking (e.g., reflecting or absorbing) blue light may be disposed on a front surface (a light-emitting surface) of the first section, the second section, or a combination thereof.

In the display device, the light source may include a plurality of light emitting units corresponding to the first section and the second section, respectively, and the light emitting units may include a first electrode and a second electrode facing each other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device and the organic light emitting diode (OLED) may be selected appropriately and are not particularly limited. The light source includes an organic light emitting diode (OLED) emitting blue light (and optionally, green light).

Figure 2:
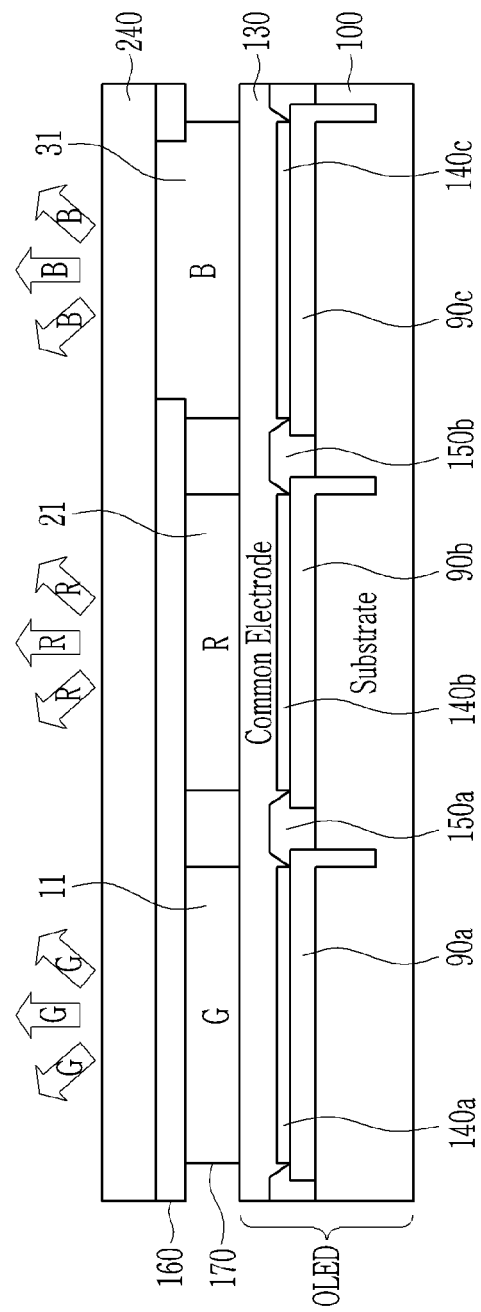
FIG. 2 is a cross-sectional view of a device according to an embodiment.

FIGS. 1 and 2 are schematic cross-sectional views of display devices according to embodiments. Referring to FIGS. 1 and 2, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode (OLED).

The pixel areas of the OLED may be disposed corresponding to the first, second, and third sections that will be described in detail below, respectively.

A stack structure including a quantum dot-polymer composite (e.g., a section including red quantum dot and a section including green quantum dot) pattern and a substrate may be disposed on the light source. The sections are configured so that blue light emitted from the light source is entered thereinto and red light and green light may be emitted, respectively. Blue light emitted from the light source may pass through the third section.

The light (e.g., blue light) emitted from the light source may enter the second section 21 and the first section 11 of the pattern 170 to emit (e.g., converted) red light R and green light G, respectively. The blue light B emitted from the light source passes through or transmits from the third section 31. Over the second section emitting red light, the first section emitting green light, or a combination thereof, an optical element 160 may be disposed. The optical element may be a blue cut layer which cuts (e.g., reflects or absorbs) blue light and optionally green light, or a first optical filter. The blue cut layer 160 may be disposed on the upper substrate 240. The blue cut layer 160 may be disposed between the upper substrate 240 and the quantum dot-polymer composite pattern and over the first section 11 and the second section 21. Details of the blue cut layer are the same as set forth for the first optical filter 310 below.

The device may be obtained by separately fabricating the stack structure and (e.g., blue light emitting) LED or OLED and then assembling the same. Alternatively, the device may be obtained by forming a quantum dot-polymer composite pattern directly on the LED or OLED.

The substrate may be a substrate including an insulating material. The substrate may include glass; various polymers such as a polyester (e.g., polyethylene terephthalate (PET) polyethylene naphthalate (PEN), a polymethacrylate, or a polyacrylate); a polycarbonate; a polysiloxane (e.g., polydimethylsiloxane (PDMS)); an inorganic material such as $Al_2O_3$ or ZnO; or a combination thereof, but is not limited thereto. A thickness of the substrate may be selected appropriately considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detail structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described below.

The pixel electrode may function as an anode of the display device. The pixel electrode may be formed of a transparent conductive material such as indium tin oxide (ITO) or indium zinc oxide (IZO). The pixel electrode may be formed of a material having a light-blocking property such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure where the transparent conductive material and the material having light-blocking properties are stacked sequentially.

Between two adjacent pixel electrodes, a pixel define layer (PDL) overlapped with a terminal end of the pixel electrode to divide the pixel electrode into a pixel unit. The pixel define layer is an insulation layer which may electrically block the at least two pixel electrodes.

The pixel define layer covers a part of the upper surface of the pixel electrode, and the remaining region of the pixel electrode where is not covered by the pixel define layer may provide an opening. An organic emission layer that will be described below may be formed on the region defined by the opening.

The organic emission layer defines each pixel area by the pixel electrode and the pixel define layer. In other words, one pixel area may be defined as an area where is formed with one organic emission unit layer which is contacted with one pixel electrode divided by the pixel define layer.

For example, in the display device according to an embodiment, the organic emission layer may be defined as a first pixel area, a second pixel area and a third pixel area, and each pixel area is spaced apart from each other leaving a predetermined interval by the pixel define layer.

In an embodiment, the organic emission layer may emit a third light belong to visible light region or belong to UV region. That is, each of the first to the third pixel areas of the organic emission layer may emit a third light. In an embodiment, the third light may be a light having the highest energy in the visible light region, for example, may be blue light. When all pixel areas of the organic emission layer are designed to emit the same light, each pixel area of the organic emission layer may be all formed of the same or similar materials or may show the same or similar properties. Thus it may significantly relieve a process difficulty of forming the organic emission layer, so the display device may be easily applied for the large scale/large area process. However, the organic emission layer according to an embodiment is not necessarily limited thereto, but the organic emission layer may be designed to emit at least two different lights.

The organic emission layer includes an organic emission unit layer in each pixel area, and each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stack structure and the lower substrate, and in the stack structure, the light emission layer may be disposed to face the liquid crystal layer. The display device may further include a polarizer between the liquid crystal layer and the emission layer. The light source may further include LED and if desired, a light guide panel.

Figure 3:
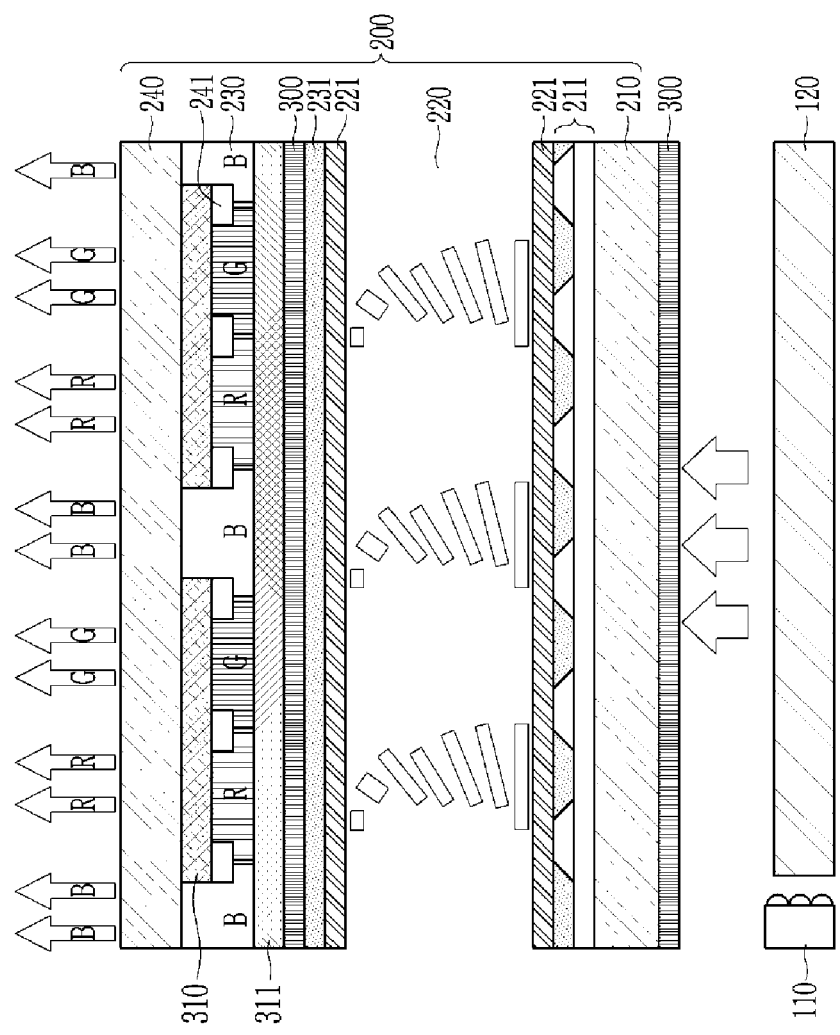
FIG. 3 is a cross-sectional view of a device according to an embodiment.

Non-limiting examples of the display device (e.g., a liquid crystal display device) according to an embodiment are illustrated with a reference to a drawing. FIG. 3 is a schematic cross sectional view showing a liquid crystal display according to an embodiment. The display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stack structure, and a liquid crystal layer 220 disposed between the stack structure and the lower substrate. The stack structure includes a transparent substrate 240 and a photoluminescent layer 230 including a pattern including a quantum dot-polymer composite.

The lower substrate 210 also referred to be an array substrate may be a transparent insulating material substrate. The substrate is the same as described above. A wire plate 211 is provided on an upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizer 300 is provided under the lower substrate. Materials and structures of the polarizer 300 are known and are not particularly limited. A backlight unit (e.g., emitting blue light) may be disposed under the polarizer 300.

An upper optical element or an upper polarizer 300 may be provided between the liquid crystal layer 220 and the transparent substrate 240, but is not limited thereto. For example, the upper polarizer may be disposed between the liquid crystal layer 220 and the light emission layer 230. The polarizer may be any polarizer that used in a liquid crystal display device. The polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector, a light guide panel provided on the reflector and providing a planar light source with the liquid crystal panel 200, at least one optical sheet on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector, and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are known and are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit a first light (e.g., red light), a second section (G) configured to emit a second light (e.g., green light), and a third section (B) configured to emit/transmit, for example blue light. If needed, the photoluminescent layer may further include at least one fourth section. The fourth section may include a quantum dot that emits different color from light emitted from the first to third sections (e.g., cyan, magenta, and yellow light).

In the light emission layer 230, sections forming a pattern may be repeated corresponding to pixel areas formed on the lower substrate. A transparent common electrode 231 may be provided on the photoluminescent layer 230 (e.g., photoluminescent color filter layer).

The third section (B) configured to emit/transmit blue light may be a transparent color filter that does not change a light emitting spectrum of the light source. In this case, blue light emitted from the backlight unit may enter in a polarized state and may be emitted through the polarizer and the liquid crystal layer as it is. If needed, the third section may include a quantum dot emitting blue light.

If desired, the display device may further include a light blocking layer (blue cut filter) or a first optical filter layer. The blue light blocking layer may be disposed between bottom surfaces of the first section (R) and the second section (G) and the upper substrate 240 or on a top surface of the upper substrate 240. The blue light blocking layer may include a sheet having openings that correspond to a pixel area showing a blue color (e.g., third section) and may be formed on portions corresponding to the first and second sections. The first optical filter layer may be integrally formed as one body structure at the portions except portions overlapped with the third section, but is not limited thereto. At least two first optical filter layers may be spaced apart and be disposed on each of the positions overlapped with the first and the second sections.

In an embodiment, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, and/or yellow light that is mixed light thereof.

In an embodiment, the first optical filter layer may substantially block blue light having a wavelength of less than or equal to about 500 nm and may transmit light in another visible light wavelength region of greater than about 500 nm and less than or equal to about 700 nm.

In an embodiment, the first optical filter layer may have light transmittance of greater than or equal to about 70%, greater than or equal to about 80%, greater than or equal to about 90%, or even about 100% with respect to the other visible light of greater than about 500 nm and less than or equal to about 700 nm.

The first optical filter layer may include a polymer thin film including a dye, a pigment, or a combination thereof that absorbs light having a wavelength to be blocked. The first optical filter layer may block at least 80%, or at least 90%, even at least 95% of blue light having a wavelength of less than or equal to about 480 nm and it may have light transmittance of greater than or equal to about 70%, greater than or equal to about 80%, greater than or equal to about 90%, or even about 100% with respect to other visible light of greater than about 500 nm and less than or equal to about 700 nm.

The first optical filter layer may block (e.g., absorb) and substantially block blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include at least one of a first region and a second region wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter (layer) may contribute to improving color purity of a display device.

The first optical filter layer may be a reflective filter including a plurality of layers (e.g., inorganic material layers) with different refractive index. For example two layers having different refractive index may be alternately stacked with each other, or for example a layer having a high refractive index and a layer having a low refractive index may be alternately stacked with each other.

As refractive index different between the layer having a high refractive index and the layer having a low refractive index is higher, the first optical filter layer having higher wavelength selectivity may be provided. A thickness and the number of the stacked layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, from about 3 nm to about 10,000 nm, about 300 nm to about 10,000 nm, or about 1,000 nm to about 10,000 nm. The high refractive index layers may have the same thickness, the same material, or a combination thereof as one another or a different thickness, a different material, or a combination thereof from each other. The low refractive index layers may have the same thickness, the same material, or a combination thereof as one another or a different thickness, a different material, or a combination thereof from each other.

The display device may further include a second optical filter layer 311 (e.g., a red/green or yellow light recycling layer) disposed between the light emission layer and the liquid crystal layer (e.g., between a light emission layer and an upper polarizer) and transmitting at least a part of the third light and reflecting at least a part of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated single layer having an approximately planar surface.

In an embodiment, the second optical filter layer may include a monolayer having a low refractive index, for example, it may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, it may be formed by alternatively stacking two layers having different refractive indexes, or for example, it may be formed by alternatively stacking material having a high refractive index and material having a low refractive index.

The layer having a high refractive index in the second optical filter layer may include, for example, at least one of hafnium oxide, tantalum oxide, titanium oxide, zirconium oxide, magnesium oxide, cesium oxide, lanthanum oxide, indium oxide, niobium oxide, aluminum oxide, and silicon nitride, but according to embodiments, it may include a variety of materials having a higher refractive index than the layer having a low refractive index.

The layer having a low refractive index in the second optical filter layer may include, for example, a silicon oxide, but according to embodiments, it may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, each thickness of the layer having a high refractive index and the layer having a low refractive index and the stacked number thereof may be determined depending upon a refractive index of each layer and the reflected wavelength, for example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least one part of the first light (R) and the second light (G) and transmits at least one part (e.g., whole part) of the third light (B). For example, the second optical filter layer may transmit only the third light (B) in a blue light wavelength region of less than or equal to about 500 nm and light in a wavelength region of greater than about 500 nm, that is, green light (G), yellow light, red light (R), and the like may be not passed through the second optical filter layer and reflected. Thus the reflected green light and red light may pass through the first and the second sections to be emitted to the outside of the display device 10.

The second optical filter layer may reflect a wavelength region of greater than about 500 nm in greater than or equal to about 70%, greater than or equal to about 80%, or greater than or equal to about 90%, or even about 100%.

Meanwhile, the second optical filter layer may have a transmittance to a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or even about 100%.

In an embodiment, the stack structure may be produced by a method using the photoresist composition. The method may include forming a film of the composition on a substrate;

exposing a selected region of the film to light (e.g., a wavelength of less than or equal to about 400 nm); and developing the exposed film with an alkali developing solution to obtain a pattern including the quantum dot-polymer composite.

The substrate and the composition have the same specification as described above. Non-limiting methods of forming the pattern are illustrated, referring to FIG. 4.

The composition is coated to have a predetermined thickness on a substrate in an appropriate method of spin coating, slit coating, and the like (S1). The formed film may be, optionally, pre-baked (PRB) (S2). The pre-baking may be performed by selecting an appropriate condition from known conditions of a temperature, time, an atmosphere, and the like.

The formed (or optionally pre-baked) film is exposed to light having a predetermined wavelength under a mask having a predetermined pattern (S3). A wavelength and intensity of the light may be selected considering types and amounts of the photoinitiator, types and amounts of the quantum dots, and the like.

The exposed film is treated with an alkali developing solution (e.g., dipping or spraying) to dissolve an unexposed region and obtain a desired pattern (S4). The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes) (S5).

In an embodiment where the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green quantum dot, or optionally, a blue quantum dot) and an appropriate number of times (e.g., twice or more or three times or more) repeating a formation of the above pattern about each composition (S6). For example, the quantum dot-polymer composite may have, e.g., be provided in, a pattern including at least two repeating color sections (e.g., RGB sections). The quantum dot-polymer composite pattern may be used as a photoluminescence-type color filter in a display device.

In an embodiment, the stack structure may be produced using an ink composition. The method may include depositing the same (e.g., to provide a desirable pattern) on the desirable substrate using an appropriate system (e.g., droplet discharging device such as inkjet or nozzle printing device) and heating the same to remove a solvent and to perform a polymerization. The method may provide a highly precise quantum dot-polymer composite film or pattern in a simple and rapid way.

An embodiment provides an electronic device including the quantum dot. The device may include a light emitting diode (LED), an organic light emitting diode (OLED), a sensor, a solar cell, an imaging sensor, or a liquid crystal display (LCD), but is not limited thereto Hereinafter, the embodiments are illustrated in more detail with reference to examples. However, they are exemplary embodiments of the present invention, and the present invention is not limited thereto.

EXAMPLES

Analysis Methods

1. Ultraviolet (UV)-Visible (Vis) Absorption Analysis

An Agilent Cary5000 spectrometer is used to perform a UV spectroscopy analysis and UV-Visible absorption spectrum is obtained.

2. Photoluminescence Analysis

Photoluminescence Analysis is done using Hitachi F-7000 spectrometer and a photoluminescence spectrum is obtained.

3. ICP Analysis

An inductively coupled plasma-atomic emission spectroscopy (ICP-AES) analysis is performed using Shimadzu ICPS-8100.

4. Brightness and Luminous Efficiency of Quantum Dot Polymer Composite

Light dose of blue excitation light (B) is measured by using an integrating sphere. Then, a QD polymer composite is placed in the integrating sphere and is irradiated with the blue excitation light to measure a green (or red) light dose (A) emitted from the composite and a blue light dose (B') passing the composite.

The blue light absorption and the quantum efficiency are obtained according to the following formulae:

$$\text{Blue light absorption rate} = (B-B')/B \times 100\%$$

$$\text{Quantum efficiency} = A/B \times 100\%$$

B: Light dose of blue excitation light

A: Light dose of green (or red) light emitted from composite by irradiating blue excitation light B': Light dose of blue excitation light emitted from composite Production of InP and InZnP cores

Reference Example 1: InP Cores are Prepared in the Following Manner

Indium acetate and palmitic acid are dissolved in 1-octadecene in a 200 milliliters (mL) reaction flask, subjected to a vacuum state at 120° C. for one hour. A molar ratio of indium to palmitic acid is 1:3. The atmosphere in the flask is exchanged with $N_2$. After the reaction flask is heated to 280° C., a mixed solution of tris(trimethylsilyl)phosphine ($TMS_3P$) and trioctylphosphine (TOP) is quickly injected, and the reaction proceeds for a predetermined time (e.g., for about 20 minutes). The reaction mixture then is rapidly cooled to room temperature and acetone is added thereto to produce nanocrystals, which are then separated by centrifugation and dispersed in toluene to obtain a toluene dispersion of the InP core nanocrystals. The amount of the $TMS_3P$ is about 0.75 moles per one mole of indium. A (average) size of the InP core thus obtained is about 3.6 nanometers (nm).

Reference Example 2: InZnP Cores are Prepared in the Following Manner

An InZnP core is prepared in the same manner as set forth in Reference Example 1 except that Zinc acetate is further used in an amount of one mole per one mole of the indium precursor. A (average) size of the InZnP core thus obtained is about 2.1 nm.

Green Quantum Dots

Example 1

1. Synthesis of Quantum Dots and Characterization Thereof (1) Selenium and sulfur are dispersed in trioctylphosphine (TOP) to obtain a Se/TOP stock solution and a S/TOP stock solution, respectively.

In a 200 mL reaction flask, zinc acetate and oleic acid are dissolved in trioctyl amine and the solution is subjected to vacuum at 120° C. for 10 minutes. The atmosphere in the reaction flask is replaced with $N_2$. While the resulting solution is heated to about 320° C., a toluene dispersion of the InZnP semiconductor nanocrystal core prepared in Reference Example 2 is injected thereto and a predetermined amount of Se/TOP stock solution is injected into the reaction flask over three times. A reaction is carried out to obtain a reaction solution including a particle having a ZnSe shell disposed on the InZnP core. A total of reaction time is 100 minutes and a total amount of the Se as used per one mole of the indium is about 13 moles.

Then, at the aforementioned reaction temperature, the S/TOP stock solution is injected to the reaction mixture. A reaction is carried out to obtain a resulting solution including a particle having a ZnS shell disposed on the ZnSe shell. A total of reaction time is 40 minutes and a total amount of the S as used per one mole of the indium is about 12 moles.

An excess amount of ethanol is added to the final reaction mixture including the resulting InZnP/ZnSe/ZnS semiconductor nanocrystals, which is then centrifuged. After centrifugation, the supernatant is discarded and the precipitate is dried and dispersed in chloroform to obtain a quantum dot solution (hereinafter, QD solution).

(2) For the obtained QD solution, an ICP-AES analysis is made and the results are shown in Table 1. A UV-vis absorption spectroscopic analysis and a photoluminescence spectroscopic analysis are made for the QD solution, and the results are shown in Table 1.

2. Production of a Quantum Dot Polymer Composite and a Pattern Thereof (1) Preparation of Quantum Dot-Binder Dispersion A chloroform solution of the quantum dots prepared above is mixed with a solution of a binder polymer, which is a four membered copolymer of methacrylic acid, benzyl methacrylate, hydroxyethyl methacrylate, and styrene, (acid value: 130 milligrams (mg) of KOH per gram (mg KOH/g), molecular weight: 8,000 g/mol, acrylic acid:benzyl methacrylate:hydroxyethyl methacrylate:styrene (molar ratio)=61.5:12:16.3:10.2) (solvent: propylene glycol monomethyl ether acetate, PGMEA, a concentration of 30 percent by weight, wt %) to form a quantum dot-binder dispersion.

(2) Preparation of a Photosensitive Composition

To the quantum dot-binder dispersion prepared above, a hexaacrylate having the following structure (as a photopolymerizable monomer), ethylene glycol di-3-mercaptopropionate (hereinafter, 2T, as a multi-thiol compound), an oxime ester compound (as an initiator), $TiO_2$ as a metal oxide fine particle, and PGMEA (as a solvent) are added to obtain a composition.

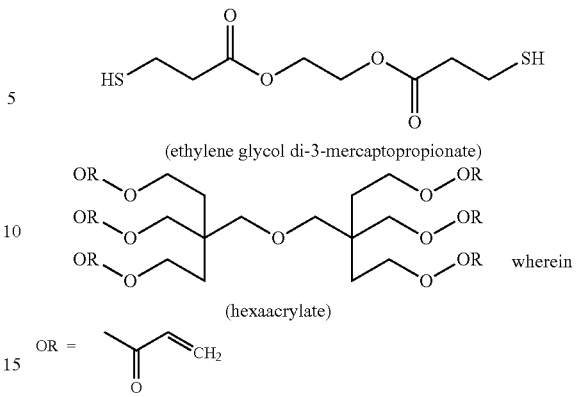

Based on a total solid content, the prepared composition includes 40 wt % of quantum dots, 12.5 wt % of the binder polymer, 25 wt % of 2 T, 12 wt % of the photopolymerizable monomer, 0.5 wt % of the photoinitiator, and 10 wt % of the metal oxide fine particle. The total solid content is about 25%.

(3) Formation of Quantum Dot-Polymer Composite Pattern and Heat Treatment Thereof The composition obtained above is spin-coated on a glass substrate at 150 revolutions per minute (rpm) for 5 seconds (s) to provide a film. The obtained film is pre-baked at 100° C. (PRB). The pre-baked film is exposed to light (wavelength: 365 nanometers (nm), intensity: 100 millijoules, mJ) under a mask having a predetermined pattern (e.g., a square dot or stripe pattern) for 1 second (s) (EXP) and developed with a potassium hydroxide aqueous solution (concentration: 0.043 weight %) for 50 seconds to obtain a pattern of a quantum dot polymer composite (thickness: 6 micrometers (μm)).

The obtained pattern is heat-treated at a temperature of 180° C. for 30 minutes under a nitrogen atmosphere (FOB).

For the obtained pattern film, a photoluminescent peak wavelength, blue light absorption rate, and a photoconversion efficiency are measured and the results are shown in Table 1.

Examples 2 and 3

1. An InZnP/ZnSe/ZnS quantum dot of Example 2 is prepared in the same manner as set forth in Example 1, except that per one mole of indium, a total amount of the Se and a total amount of the S as used are 7 moles and 4.7 moles, respectively.

An InZnP/ZnSe/ZnS quantum dot of Example 3 is prepared in the same manner as set forth in Example 1, except that per one mole of indium, a total amount of the Se and a total amount of the S as used are 6 moles and 4 moles, respectively.

For the obtained QD solutions, an ICP-AES analysis, an UV-vis absorption spectroscopic analysis and a photoluminescence spectroscopic analysis are made and the results are shown in Table 1.

2. A quantum dot polymer composite is prepared in the same manner as set forth in Example 1 except for using the quantum dots as obtained in these Examples, respectively. For the obtained film pattern, blue light absorption rate, and a photoconversion efficiency are measured and the results are shown in Table 1.

Comparative Example 1

An InZnP/ZnSe/ZnS quantum dot is prepared in the same manner as set forth in Example 1, except that per one mole of indium, a total amount of the Se and a total amount of the S as used are 6.4 moles and 26.3 moles, respectively.

For the obtained QD solutions, an ICP-AES analysis, an UV-vis absorption spectroscopic analysis and a photoluminescence spectroscopic analysis are made and the results are shown in Table 2.

A quantum dot polymer composite is prepared in the same manner as set forth in Example 1 except for using the quantum dots as obtained in this comparative example, respectively. For the obtained film pattern, blue light absorption, and a photoconversion efficiency are measured and the results are shown in Table 2.

Example 3-1 and Example 3-2

An InZnP/ZnSe/ZnS quantum dot of Example 3-1 is prepared in the same manner as set forth in Example 1, except that per one mole of indium, a total amount of the Se and a total amount of the S as used are 8 moles and 24 moles, respectively.

An InZnP/ZnSe/ZnS quantum dot of Example 3-2 is prepared in the same manner as set forth in Example 1, except that per one mole of indium, a total amount of the Se and a total amount of the S as used are 8 moles and 18 moles, respectively.

For the obtained QD solutions, an ICP-AES analysis, an UV-vis absorption spectroscopic analysis and a photoluminescence spectroscopic analysis are made and the results are shown in Table 2.

A quantum dot polymer composite is prepared in the same manner as set forth in Example 1 except for using the quantum dots as obtained in these Examples, respectively. For the obtained film pattern, blue light absorption, and a photoconversion efficiency are measured and the results are shown in Table 2.

TABLE 1

|  |  | Example 1 | Example 2 | Example 3 |
|---|---|---|---|---|
| 450 nm:350 nm absorption ratio |  | 0.090:1 | 0.102:1 | 0.110:1 |
| Quantum Yield (QY) |  | 85.3% | 78% | 80% |
| Blue light absorption rate |  | 91.2% | 92.2% | 93.6% |
| Photoluminescent Peak wavelength (nm) |  | 541 | 531 | 536 |
| ZnSe thickness (ML) |  | 4 | 3 | 3 |
| ZnS thickness (nm) |  | 0.38 | 0.21 | 0.21 |
| ICP | S/Se (moles) | 0.71 | 0.5 | 0.51 |
|  | Zn:In (moles) | 22:1 | 11:1 | 9:1 |

TABLE 2

|  |  | Comparative Example 1 | Example 3-1 | Example 3-2 |
|---|---|---|---|---|
| 450 nm:350 nm absorption ratio |  | 0.049:1 | 0.064:1 | 0.079:1 |
| Blue light absorption rate |  | 81% | 84% | 86% |
| Photoluminescent Peak wavelength (nm) |  | 536 | 538 | 538 |
| ZnSe thickness ((ML) |  | 3 | 3 | 4 |
| ZnS thickness ((nm) |  | 0.97 | 0.83 | 0.75 |
| ICP | S/Se | 3.11 | 2.22 | 1.69 |
|  | Zn:In (moles) | 49:1 | 40:1 | 31:1 |

The results of the table confirm that the quantum dots of Examples 1 to 3 may exhibit enhanced optical properties and stability in comparison with the quantum dots of Comparative Example 1. The quantum dots of Examples may have a 450 nm:350 nm absorption ratio of greater than or equal to about 0.08:1.

The film pattern of the quantum dot polymer composite including the quantum dots of Examples 1 to 3 may exhibit blue light absorption that is significantly higher than that of the film pattern of the quantum dot polymer composite including the quantum dots of Comparative Example 1.

Red Quantum Dots

Example 4

1. Synthesis of Quantum Dots and Characterization Thereof (1) Selenium and sulfur are dispersed in trioctylphosphine (TOP) to obtain a Se/TOP stock solution and a S/TOP stock solution, respectively.

In a 200 mL reaction flask, zinc acetate and oleic acid are dissolved in trioctyl amine and the solution is subjected to vacuum at 120° C. for 10 minutes. The atmosphere in the reaction flask is replaced with $N_2$. While the resulting solution is heated to about 320° C., a toluene dispersion of the InP semiconductor nanocrystal core prepared in Reference Example 1 is injected thereto and a predetermined amount of Se/TOP stock solution is injected into the reaction flask over several times. A reaction is carried out to obtain a reaction solution including a particle having a ZnSe shell disposed on the core. A total of reaction time is 80 minutes and a total amount of the Se as used per one mole of the indium is about 6 moles.

Then, at the aforementioned reaction temperature, the S/TOP stock solution is injected to the reaction mixture. A reaction is carried out to obtain a resulting solution including a particle having a ZnS shell disposed on the ZnSe shell. A total of reaction time is 40 minutes and a total amount of the S as used per one mole of the indium is about 9 moles.

An excess amount of ethanol is added to the final reaction mixture including the resulting InP/ZnSe/ZnS semiconductor nanocrystals, which is then centrifuged. After centrifugation, the supernatant is discarded and the precipitate is dried and dispersed in chloroform to obtain a quantum dot solution (hereinafter, QD solution).

(2) For the obtained QD solution, an ICP-AES analysis is made and the results are shown in Table 1. A UV-vis absorption spectroscopic analysis and a photoluminescence spectroscopic analysis are made for the QD solution, and the results are shown in Table 3.

2. Production of a Quantum Dot Polymer Composite and a Pattern Thereof

A quantum dot polymer composite is prepared in the same manner as set forth in Example 1 except for using the quantum dots as obtained in this Example. For the obtained film pattern, blue light absorption rate, and a photoconversion efficiency are measured and the results are shown in Table 3.

Examples 5 and 6

1. An InP/ZnSe/ZnS quantum dot of Example 5 is prepared in the same manner as set forth in Example 4, except that per one mole of indium, a total amount of the Se and a total amount of the S as used are 6 moles and 3 moles, respectively.

An InP/ZnSe/ZnS quantum dot of Example 6 is prepared in the same manner as set forth in Example 4, except that per one mole of indium, a total amount of the Se and a total amount of the S as used are 3 moles and 3 moles, respectively.

For the obtained QD solutions, an ICP-AES analysis, an UV-vis absorption spectroscopic analysis and a photoluminescence spectroscopic analysis are made and the results are shown in Table 3.

2. A quantum dot polymer composite is prepared in the same manner as set forth in Example 1 except for using the quantum dots as obtained in these Examples, respectively. For the obtained film pattern, blue light absorption rate, and a photoconversion efficiency are measured and the results are shown in Table 3.

Examples 7 and 8

1. An InP/ZnSe/ZnS quantum dot of Example 7 is prepared in the same manner as set forth in Example 4, except that per one mole of indium, a total amount of the Se and a total amount of the S as used are 11 moles and 10 moles, respectively.

An InP/ZnSe/ZnS quantum dot of Example 6 is prepared in the same manner as set forth in Example 4, except that per one mole of indium, a total amount of the Se and a total amount of the S as used are 11 moles and 7 moles, respectively.

For the obtained QD solutions, an ICP-AES analysis, an UV-vis absorption spectroscopic analysis and a photoluminescence spectroscopic analysis are made and the results are shown in Table 4.

2. A quantum dot polymer composite is prepared in the same manner as set forth in Example 1 except for using the quantum dots as obtained in these Examples, respectively. For the obtained film pattern, blue light absorption, and a photoconversion efficiency are measured and the results are shown in Table 4.

TABLE 3

|  | | Example 4 | Example 5 | Example 6 |
|---|---|---|---|---|
| 450 nm:350 nm absorption ratio | | 0.114:1 | 0.128:1 | 0.148:1 |
| Blue light absorption rate | | 91.2% | 93.1% | 94.8% |
| Photoluminescent Peak wavelength (nm) | | 636 | 635 | 631 |
| QY | | 87% | 85% | 92% |
| ZnSe thickness (ML) | | 4 | 4 | 3 |
| ZnS thickness (nm) | | 0.69 | 0.28 | 0.43 |
| ICP | S/Se | 1.19 | 0.4 | 1 |
|  | Zn:In (moles) | 12:1 | 8:1 | 6:1 |

TABLE 4

|  | | Example 7 | Example 8 |
|---|---|---|---|
| 450 nm:350 nm absorption ratio | | 0.092:1 | 0.102:1 |
| Blue light absorption rate | | 87% | 88% |
| Photoluminescent Peak wavelength (nm) | | 630 | 637 |
| ZnSe (ML) | | 6 | 7 |
| ZnS (nm) | | 0.58 | 0.40 |
| ICP | S/Se | 0.71 | 0.49 |
|  | Zn:In (moles) | 17:1 | 16:1 |

The results of the table confirm that the quantum dots of Examples 4 to 6 may exhibit enhanced optical properties and stability. The quantum dots of Examples may have a 450 nm:350 nm absorption ratio of greater than or equal to about 0.08:1.

The film pattern of the quantum dot polymer composite including the quantum dots of Examples 4 to 6 may exhibit improved blue light absorption rate, for example, of greater than or equal to about 89%, e.g., from about 91% to about 95%.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising
a semiconductor nanocrystal core comprising indium and phosphorous,
a first semiconductor nanocrystal shell disposed on the semiconductor nanocrystal core, the first semiconductor nanocrystal shell comprising zinc and selenium, and
a second semiconductor nanocrystal shell disposed on the first semiconductor nanocrystal shell, the second semiconductor nanocrystal shell comprising zinc and sulfur,
wherein the quantum dot does not comprise cadmium, and
wherein in the quantum dot, a mole ratio of sulfur with respect to selenium is less than or equal to about 2.5:1, and
wherein when the quantum dot has a photoluminescent peak wavelength in a range from about 500 nanometers to about 550 nanometers, and a molar ratio of zinc with respect to indium is less than or equal to 48:1, and
when the quantum dot has a photoluminescent peak wavelength in a range from about 600 nanometers to about 650 nanometers, a molar ratio of zinc with respect to indium is less than or equal to about 30:1.

2. The quantum dot of claim 1, wherein a thickness of the first semiconductor nanocrystal shell is greater than or equal to about 3 monolayers.

3. The quantum dot of claim 1, wherein a thickness of the second semiconductor nanocrystal shell is less than 0.7 nanometers.

4. The quantum dot of claim 1, wherein when the quantum dot has a photoluminescent peak wavelength in a range from about 500 nanometers to about 550 nanometers, and a molar ratio of zinc with respect to indium is less than or equal to about 47:1 and
when the quantum dot has a photoluminescent peak wavelength in a range from about 600 nanometers to about 650 nanometers, a molar ratio of zinc with respect to indium is less than or equal to about 28:1.

5. The quantum dot of claim 1, wherein when the quantum dot has a photoluminescent peak wavelength in a range from about 500 nanometers to about 550 nanometers, a molar ratio of sulfur with respect to selenium is greater than or equal to about 0.05:1 and less than or equal to about 1:1 and
when the quantum dot has a photoluminescent peak wavelength in a range from about 600 nanometers to about 650 nanometers, a molar ratio of sulfur with respect to selenium is greater than or equal to about 0.1:1 and less than or equal to about 2:1.

6. The quantum dot of claim 1, wherein a thickness of the first semiconductor nanocrystal shell is greater than or equal to about 0.9 nanometers and less than or equal to about 3.1 nanometers.

7. The quantum dot of claim 1, wherein a thickness of the second semiconductor nanocrystal shell is less than or equal to about 0.6 nanometers.

8. The quantum dot of claim 1, wherein a quantum efficiency of the quantum dot is greater than or equal to about 65%.

9. The quantum dot of claim 1, wherein a quantum efficiency of the quantum dot is greater than or equal to about 70%.

10. The quantum dot of claim 1, wherein in an ultraviolet-visible absorption spectrum of the quantum dot, a ratio of an absorbance at 450 nanometers to an absorbance at 350 nanometers is greater than or equal to about 0.08:1.

11. The quantum dot of claim 1, wherein the semiconductor nanocrystal core further comprises zinc.

12. The quantum dot of claim 1, wherein the first semiconductor nanocrystal shell does not comprise sulfur.

13. The quantum dot of claim 1, wherein the first semiconductor nanocrystal shell is disposed directly on a surface of the semiconductor nanocrystal core.

14. The quantum dot of claim 1, wherein the second semiconductor nanocrystal shell is an outermost layer of the quantum dot.

15. The quantum dot of claim 1, wherein the second semiconductor nanocrystal shell is disposed directly on a surface of the first semiconductor nanocrystal shell.

16. The quantum dot of claim 1, wherein when the quantum dot has a photoluminescent peak wavelength in a range from about 500 nanometers to about 550 nanometers, the core has a size of greater than or equal to about 1 nanometer and less than about 2.7 nanometers, and when the quantum dot has a photoluminescent peak wavelength in a range from about 600 nanometers to about 650 nanometers, the core has a size of greater than or equal to about 2 nanometers.

17. The quantum dot of claim 1, wherein the quantum dot does not comprise an alkane monothiol compound on a surface thereof.

18. A quantum dot-polymer composite comprising:
a polymer matrix; and
a plurality of quantum dots comprising the quantum dot of claim 1 dispersed in the polymer matrix.

19. The quantum dot-polymer composite of claim 18, wherein the polymer matrix comprises a carboxylic acid group containing binder polymer, and wherein the carboxylic acid group containing binder polymer comprises:

a copolymer of a monomer mixture comprising a first monomer comprising a carboxylic acid group and a carbon-carbon double bond, a second monomer comprising a carbon-carbon double bond and a hydrophobic moiety and not comprising a carboxylic acid group, and optionally a third monomer comprising a carbon-carbon double bond and a hydrophilic moiety and not comprising a carboxylic acid group;

a multiple aromatic ring-containing polymer comprising a backbone structure in which two aromatic rings are bound to a quaternary carbon atom that is a constituent atom of another cyclic moiety in a main chain of the backbone structure, the multiple aromatic ring-containing polymer comprising a carboxylic acid group; or a combination thereof.

20. The quantum dot-polymer composite of claim 18, wherein the polymer matrix further comprises a polymerization product of a monomer combination comprising a thiol compound comprising at least one thiol group and an ene compound comprising a carbon-carbon unsaturated bond, a metal oxide fine particle, or a combination thereof.

21. The quantum dot-polymer composite of claim 18, wherein the quantum dot-polymer composite is in the form of a patterned film.

22. The quantum dot-polymer composite of claim 18, wherein when the quantum dot-polymer composite is in the form of a film having a thickness of about 6 micrometers, an amount of the plurality of quantum dots is less than or equal to about 45% by weight, based on a total weight of the composite, and an absorption of blue light of a wavelength of about 450 nanometers is greater than or equal to about 89%.

23. A display device, comprising
a light source and a light emitting element,
wherein the light emitting element comprises the quantum dot-polymer composite of claim 18 and the light source is configured to provide the light emitting element with incident light.

24. The display device of claim 23, wherein the incident light has a luminescence peak wavelength of about 440 nanometers to about 460 nanometers.

25. The display device of claim 23, wherein, the light emitting element comprises a sheet comprising the quantum dot-polymer composite.

26. The display device of claim 23, wherein the light emitting element comprises a stacked structure comprising a substrate and a light emitting layer disposed on the substrate, wherein the light emitting layer comprises a pattern comprising the quantum dot-polymer composite and the pattern comprises a repeating section configured to emit light at a predetermined wavelength.

27. The display device of claim 26, wherein the pattern comprises a first section configured to emit a first light and a second section configured to emit a second light having a center wavelength that is different from a center wavelength of the first light.

* * * * *